United States Patent
Kurokawa

(10) Patent No.: US 10,650,727 B2
(45) Date of Patent: May 12, 2020

(54) SEMICONDUCTOR DEVICE, DISPLAY DEVICE, AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/718,289

(22) Filed: Sep. 28, 2017

(65) Prior Publication Data
US 2018/0096648 A1  Apr. 5, 2018

(30) Foreign Application Priority Data
Oct. 4, 2016 (JP) .................. 2016-196153

(51) Int. Cl.
*G09G 3/20* (2006.01)
*H01L 27/12* (2006.01)
(Continued)

(52) U.S. Cl.
CPC ..... *G09G 3/2096* (2013.01); *G02F 1/133555* (2013.01); *G06F 1/3218* (2013.01);
(Continued)

(58) Field of Classification Search
CPC .. G09G 3/2096; G09G 3/3688; G09G 3/3275; G09G 2380/02; G09G 2320/0686;
(Continued)

(56) References Cited

U.S. PATENT DOCUMENTS

| 6,714,268 B2 | 3/2004 | Wang et al. |
| 7,038,641 B2 * | 5/2006 | Hirota ................. G02B 6/0055 345/102 |

(Continued)

FOREIGN PATENT DOCUMENTS

| JP | 2001-066593 A | 3/2001 |
| JP | 2002-196702 A | 7/2002 |

(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.

(Continued)

*Primary Examiner* — Christopher E Leiby
(74) *Attorney, Agent, or Firm* — Robinson Intelletual Property Law Office; Eric J. Robinson

(57) ABSTRACT

An object is to provide a semiconductor device with low power consumption. The semiconductor device includes a controller, a register, and an image processing portion. The image processing portion has a function of taking image data from a frame memory and a parameter from the register and processing the image data by using the parameter. The frame memory has a function of retaining the image data while power supply is stopped. The register has a function of retaining the parameter while power supply is stopped. The controller controls power supply to the register, the frame memory, and the image processing portion. The register includes first and second scan chain registers. The first scan chain register stores a parameter related to a first display region. The second scan chain register stores a parameter related to a second display region. A parameter is changed by loading of data of the first or second scan chain register.

10 Claims, 18 Drawing Sheets

(51) Int. Cl.
*H01L 29/786* (2006.01)
*G02F 1/1335* (2006.01)
*G06F 1/3218* (2019.01)
*G06F 1/3234* (2019.01)
*G09G 3/3275* (2016.01)
*G02F 1/1362* (2006.01)
*G02F 1/1368* (2006.01)
*G02F 1/1333* (2006.01)
*G09G 3/36* (2006.01)

(52) U.S. Cl.
CPC ........ *G06F 1/3265* (2013.01); *H01L 27/1225* (2013.01); *H01L 27/1255* (2013.01); *H01L 29/7869* (2013.01); *G02F 1/1368* (2013.01); *G02F 1/133345* (2013.01); *G02F 1/136209* (2013.01); *G02F 2001/136222* (2013.01); *G02F 2201/121* (2013.01); *G02F 2203/09* (2013.01); *G09G 3/3275* (2013.01); *G09G 3/3688* (2013.01); *G09G 2310/08* (2013.01); *G09G 2320/0626* (2013.01); *G09G 2320/0666* (2013.01); *G09G 2320/0686* (2013.01); *G09G 2330/021* (2013.01); *G09G 2360/12* (2013.01); *G09G 2380/02* (2013.01)

(58) Field of Classification Search
CPC ... G09G 2320/0626; G09G 2320/0666; G09G 2330/021; G09G 2360/12; G09G 2310/08; H01L 27/1255; H01L 27/1225; H01L 29/7869; G02F 1/133555; G02F 1/1368; G02F 1/136209; G02F 1/133345; G02F 2203/09; G02F 2001/136222; G02F 2201/121
See application file for complete search history.

(56) References Cited

U.S. PATENT DOCUMENTS

| | | | |
|---|---|---|---|
| 7,084,936 B2 | 8/2006 | Kato | |
| 7,102,704 B2* | 9/2006 | Mitsui | G02F 1/133603 349/62 |
| 7,176,991 B2 | 2/2007 | Mitsui et al. | |
| 7,239,361 B2 | 7/2007 | Kato | |
| 7,248,235 B2* | 7/2007 | Fujii | G02F 1/133555 345/76 |
| 7,385,654 B2 | 6/2008 | Mitsui et al. | |
| 8,648,772 B2* | 2/2014 | Hebenstreit | G02B 26/005 345/5 |
| 10,120,470 B2* | 11/2018 | Kurokawa | G06F 3/041 |
| 10,276,107 B2* | 4/2019 | Kurokawa | G02F 1/136 |
| 2002/0024485 A1* | 2/2002 | Koyama | G09G 3/3648 345/87 |
| 2002/0175887 A1* | 11/2002 | Yamazaki | G09G 3/20 345/87 |
| 2002/0180724 A1* | 12/2002 | Oshima | G06F 1/3203 345/212 |
| 2003/0009703 A1* | 1/2003 | Oshima | G06F 1/3218 713/323 |
| 2003/0201960 A1 | 10/2003 | Fujieda | |
| 2004/0258866 A1* | 12/2004 | Shiba | G09G 3/2011 428/35.7 |
| 2006/0072047 A1 | 4/2006 | Sekiguchi | |
| 2007/0262928 A1* | 11/2007 | Steer | G09G 3/2011 345/76 |
| 2008/0180618 A1 | 7/2008 | Fujieda | |
| 2010/0171905 A1 | 7/2010 | Huang et al. | |
| 2011/0156027 A1 | 6/2011 | Yamazaki et al. | |
| 2011/0175874 A1* | 7/2011 | Wakimoto | G09G 3/3406 345/207 |
| 2012/0268979 A1* | 10/2012 | Sekine | G11C 11/412 365/72 |
| 2018/0018752 A1* | 1/2018 | Kurokawa | G06F 1/3218 |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2011-151383 A | 8/2011 |
| JP | 2013-221965 A | 10/2013 |
| WO | WO-2004-053819 A | 6/2004 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

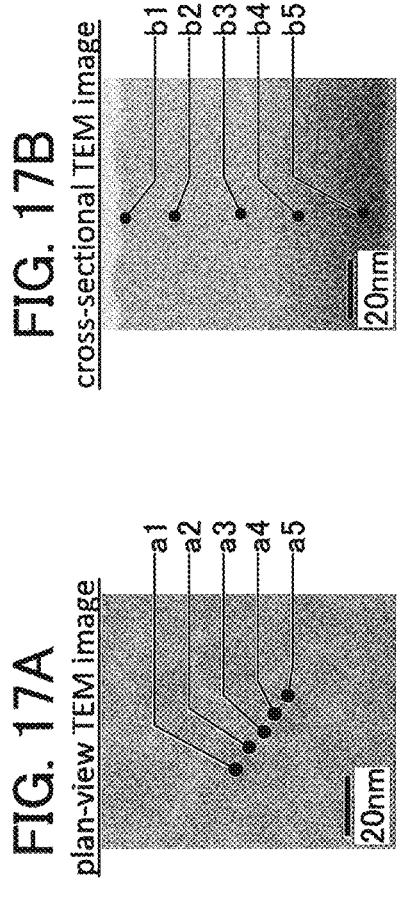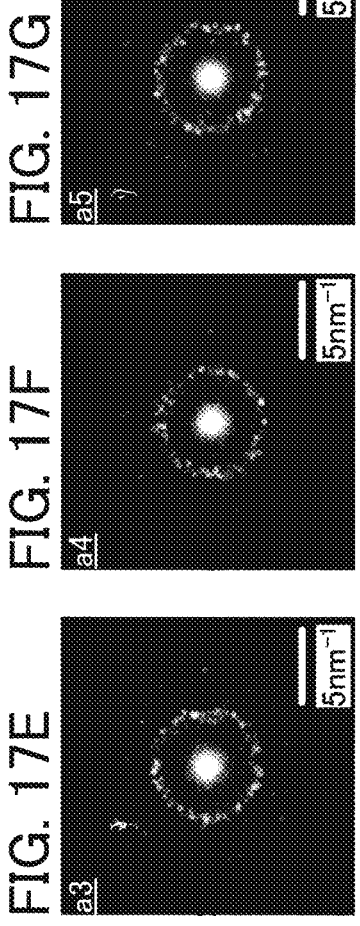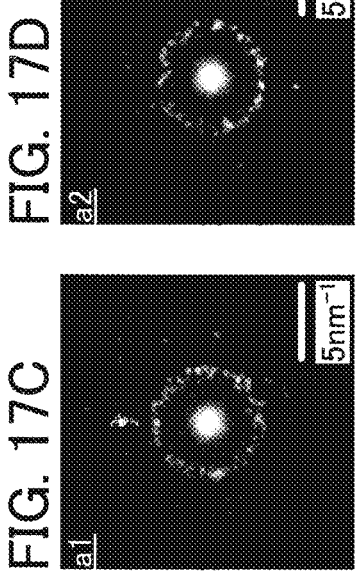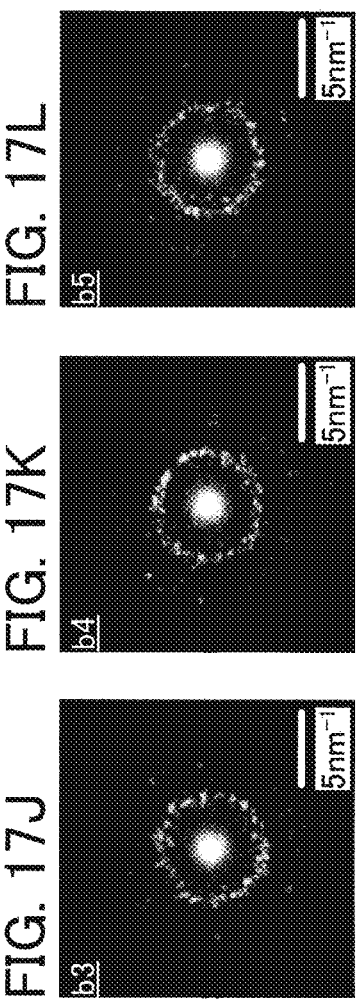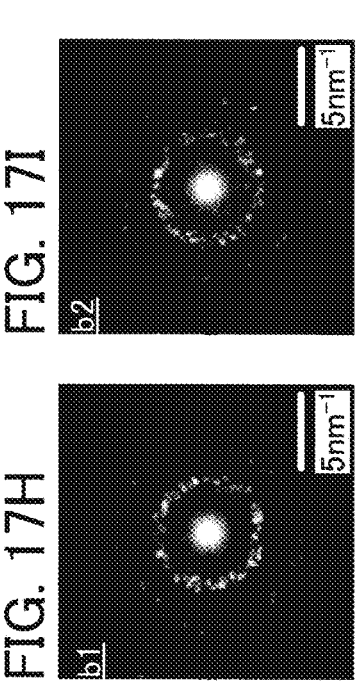

SEMICONDUCTOR DEVICE, DISPLAY DEVICE, AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

Specific examples of the technical field of one embodiment of the present invention disclosed in this specification and the like include a semiconductor device, a display device, an electronic device, a method for driving any of them, and a method for manufacturing any of them. In this specification and the like, a semiconductor device generally means a device that can function by utilizing semiconductor characteristics.

2. Description of the Related Art

Flexible display devices have been fabricated. A flexible display device can have a plurality of display regions by being folded. Moreover, there has been proposed a display device in which a reflective element and a light-emitting element are used in combination. The reflective element is used in bright environments and the light-emitting element is used in dark environments, so that it is possible to achieve a display device with low power consumption and high display quality independent of environment light.

A transistor including an oxide semiconductor exhibits an extremely low off-state current; hence, the use of the transistor in pixels of a liquid crystal display and an organic electroluminescent (EL) display can reduce refresh frequencies when a still image is displayed, and thus reduce power consumption. Note that in this specification and the like, the aforementioned technique for reducing power consumption of a display device is referred to as idling stop or IDS driving.

Furthermore, an example where a transistor including an oxide semiconductor is used for a nonvolatile memory device to utilize the low off-state current of the transistor has been disclosed (Patent Document 1).

PATENT DOCUMENT

Patent Document 1: Japanese Published Patent Application No. 2011-151383

SUMMARY OF THE INVENTION

In a display device that achieves a plurality of display regions by being folded, the display regions may sometimes face different directions. In that case, incident light varies between the display regions, and parameters such as appropriate luminance and color tones also vary between the display regions. A user of the display device can set parameters for each of the display regions; however, the user needs to reset them every time the directions of the display regions are changed.

In view of the above, an object of one embodiment of the present invention is to provide a semiconductor device that has a mechanism to set parameters such as appropriate luminance and color tones individually for a plurality of display regions. Another object of one embodiment of the present invention is to provide a semiconductor device that achieves low power consumption and has a mechanism with which display quality is not affected by stop of power supply to some circuits.

Another object of one embodiment of the present invention is to provide a novel semiconductor device. Another object of one embodiment of the present invention is to provide a novel semiconductor device with low power consumption. Another object of one embodiment of the present invention is to provide a display device including the novel semiconductor device. Another object of one embodiment of the present invention is to provide an electronic device using the display device including the novel semiconductor device.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

One embodiment of the present invention is a semiconductor device including a first controller, a register, a frame memory, and an image processing portion. The frame memory has a function of storing image data. The image processing portion has a function of processing the image data. The register has a function of store a parameter for performing processing in the image processing portion. The frame memory has a function of retaining the image data while power supply to the frame memory is stopped. The register has a function of retaining the parameter while power supply to the register is stopped. The first controller has a function of controlling power supply to the register, power supply to the frame memory, and power supply to the image processing portion. The register includes a first scan chain register, a second scan chain register, and a first register. The first scan chain register includes a second register. The second scan chain register includes a third register. First data is output to the first register from the second register, and second data is output to the first register from the third register. The first register selects one of the first data and the second data and stores the selected data. The first register outputs the stored data to the image processing portion as the parameter. The second register and the third register each include a retention circuit. The retention circuit in the second register has a function of storing the first data. The retention circuit in the third register has a function of storing the second data. Each of the retention circuits has a function of retain the stored data while power supply to the register is stopped.

One embodiment of the present invention is the semiconductor device according to the above embodiment, further including a display device. The display device includes a first display region and a second display region. The image processing portion has a function of processing image data output to the first display region, by using the first data. The image processing portion has a function of processing image data output to the second display region, by using the second data.

In any of the above embodiments, each of the retention circuits includes a first transistor and a first capacitor, the first transistor controls charging and discharging of the first capacitor, and a channel formation region of the first transistor contains a metal oxide.

In any of the above embodiments, the frame memory includes a plurality of memory cells, each of the memory cells includes a second transistor and a second capacitor, the second transistor controls charging and discharging of the second capacitor, and a channel formation region of the second transistor contains a metal oxide.

One embodiment of the present invention is the semiconductor device according to any of the above embodiments, further including a second controller. The second controller has a function of generating a timing signal. The register has a function of storing a parameter for generating the timing signal in the second controller.

In the above embodiment, the first controller has a function of controlling power supply to the second controller.

One embodiment of the present invention is the semiconductor device according to any of the above embodiments, further including a third controller. The third controller has a function of receiving a first signal from an optical sensor, and a function of generating, on the basis of the first signal, a second signal for performing processing in the image processing portion.

In any of the above embodiments, when image data and a parameter are not input from an external device, the semiconductor device has a function of generating a third signal for displaying a still image, on the basis of the image data stored in the frame memory and the parameter stored in the register.

One embodiment of the present invention is the semiconductor device according to any of the above embodiments, further including a source driver. The source driver has a function of generating a data signal on the basis of the image data processed in the image processing portion.

In any of the above embodiments, the source driver has a function of generating a first data signal or a second data signal on the basis of the image data processed in the image processing portion, the first data signal has a function of driving a reflective element, and the second data signal has a function of driving a light-emitting element.

In any of the above embodiments, the first controller has a function of controlling power supply to the source driver.

One embodiment of the present invention can provide a novel semiconductor device. One embodiment of the present invention can provide a novel semiconductor device equipped with a plurality of display regions. One embodiment of the present invention can provide a novel semiconductor device with low power consumption.

One embodiment of the present invention can provide a display device including the novel semiconductor device. One embodiment of the present invention can provide an electronic device using the display device including the novel semiconductor device.

Note that the effects of one embodiment of the present invention are not limited to the above effects. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings:

FIGS. 17A and 17B are TEM images of samples, and FIGS. 17C to 17L are electron diffraction patterns thereof.

DETAILED DESCRIPTION OF THE INVENTION

Figure 1:
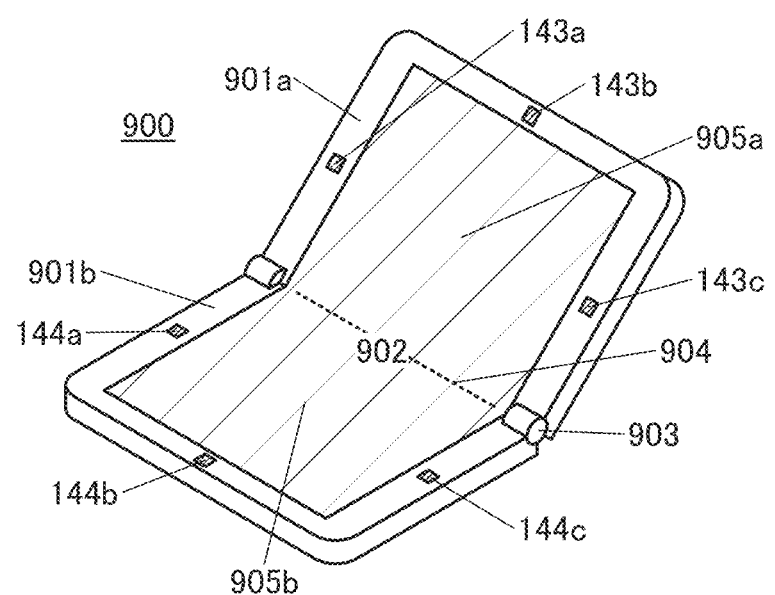
FIG. 1 illustrates a structure example of an electronic device.

Embodiments will be described below with reference to the drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Any of the embodiments described below can be combined as appropriate.

Note that a controller IC described in embodiments is a semiconductor device that includes a transistor containing silicon in a channel formation region, a transistor containing an oxide semiconductor in a channel formation region, a capacitor, and the like. Thus, a controller IC can be referred to as a semiconductor device.

In the drawings, the size, the layer thickness, the region, or the like is sometimes exaggerated for clarity, and thus is not limited to the illustrated scale. The drawings are schematic views showing ideal examples, and embodiments of the present invention are not limited to shapes or values shown in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged depending on the case or circumstances. For example, in some cases, the term "conductive film" can be used instead of the term "conductive layer," and the term "insulating layer" can be used instead of the term "insulating film."

In this specification and the like, the terms for describing arrangement, such as above and below, do not necessarily mean "directly above" and "directly below" in the description of a physical relation between components. For example, the expression "a gate electrode over a gate insulating layer" can mean the case where there is an additional component between the gate insulating layer and the gate electrode.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, ordinal numbers such as first, second, and third are used in order to avoid confusion among components, and the terms do not limit the components numerically.

In this specification and the like, the term "electrically connected" includes the case where components are connected through an object having any electric function. There is no particular limitation on the object having any electric function as long as electric signals can be transmitted and received between components that are connected through the object. Examples of the object having any electric function include an electrode, a wiring, a switching element such as a transistor, a resistor, an inductor, a capacitor, and elements with a variety of functions.

In this specification and the like, the term "voltage" often refers to a difference between a given potential and a reference potential (e.g., a ground potential). Accordingly, voltage, potential, and potential difference can also be referred to as potential, voltage, and voltage difference, respectively.

In this specification and the like, a transistor is an element having at least three terminals: a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Functions of a source and a drain are sometimes switched when transistors having different polarities are employed or when a direction of current flow is changed in circuit operation, for example. Therefore, the terms "source" and "drain" can be used interchangeably in this specification and the like.

Unless otherwise specified, the term "off-state current" in this specification and the like refers to a drain current of a transistor in an off state (also referred to as a non-conducting state and a cutoff state). Unless otherwise specified, the off state of an n-channel transistor means that a gate voltage with respect to a source voltage ($V_{gs}$) is lower than the threshold voltage ($V_{th}$), and the off state of a p-channel transistor means that $V_{gs}$ is higher than $V_{th}$. That is, the off-state current of an n-channel transistor sometimes refers to a drain current that flows when $V_{gs}$ is lower than $V_{th}$.

In the above description of the off-state current, a drain may be replaced with a source. That is, the off-state current sometimes refers to a current that flows through a source of a transistor in the off state.

In this specification and the like, the term "leakage current" sometimes expresses the same meaning as "off-state current." In this specification and the like, the off-state current sometimes refers to a current that flows between a source and a drain when a transistor is off, for example.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is sometimes called an oxide semiconductor. That is, a metal oxide that has at least one of an amplifying function, a rectifying function, and a switching function can be called a metal oxide semiconductor, or OS for short. An OS transistor or an OS FET refers to a transistor including a metal oxide or an oxide semiconductor.

Embodiment 1

In this embodiment, an electronic device including a display portion will be described as an example of a semiconductor device.

FIG. 1 illustrates a structure example of an electronic device. An electronic device 900 illustrated in FIG. 1 includes a housing 901a, a housing 901b, a hinge 903, a display portion 902, optical sensors 143a to 143c, optical sensors 144a to 144c, and the like. The display portion 902 is incorporated into the housing 901a and the housing 901b.

The electronic device 900 is foldable. The housing 901a and the housing 901b are joined to each other by the hinge 903 such that they are rotatable. The electronic device 900 can be changed in shape between a state where the housings 901a and 901b are closed and a state where the housings 901a and 901b are opened as illustrated in FIG. 1. Thus, the electronic device 900 has high portability when carried and excels in visibility when used because of its large display region.

The hinge 903 preferably has a locking mechanism so that an angle formed between the housing 901a and the housing 901b does not become larger than a predetermined angle when the housings are opened. For example, an angle at which the housings 901a and 901b become locked (they are not opened any further) is preferably greater than or equal to 90° and less than 180° and can be typically 90°, 120°, 135°, 150°, 175°, or the like. In such a case, the convenience, safety, and reliability can be improved.

The display portion 902 includes a touch panel. The electronic device 900 can be controlled by touching the display portion 902 with a finger, a stylus, or the like.

The display portion 902 is formed using one flexible display. Thus, an image can be displayed continuously between the housing 901a and the housing 901b. The display portion 902 is divided into a first display region 905a and a second display region 905b by a folding line 904.

A display device including the display portion 902, particularly a controller IC of the display device will be described below.

<<Display Device>>

Figure 2:
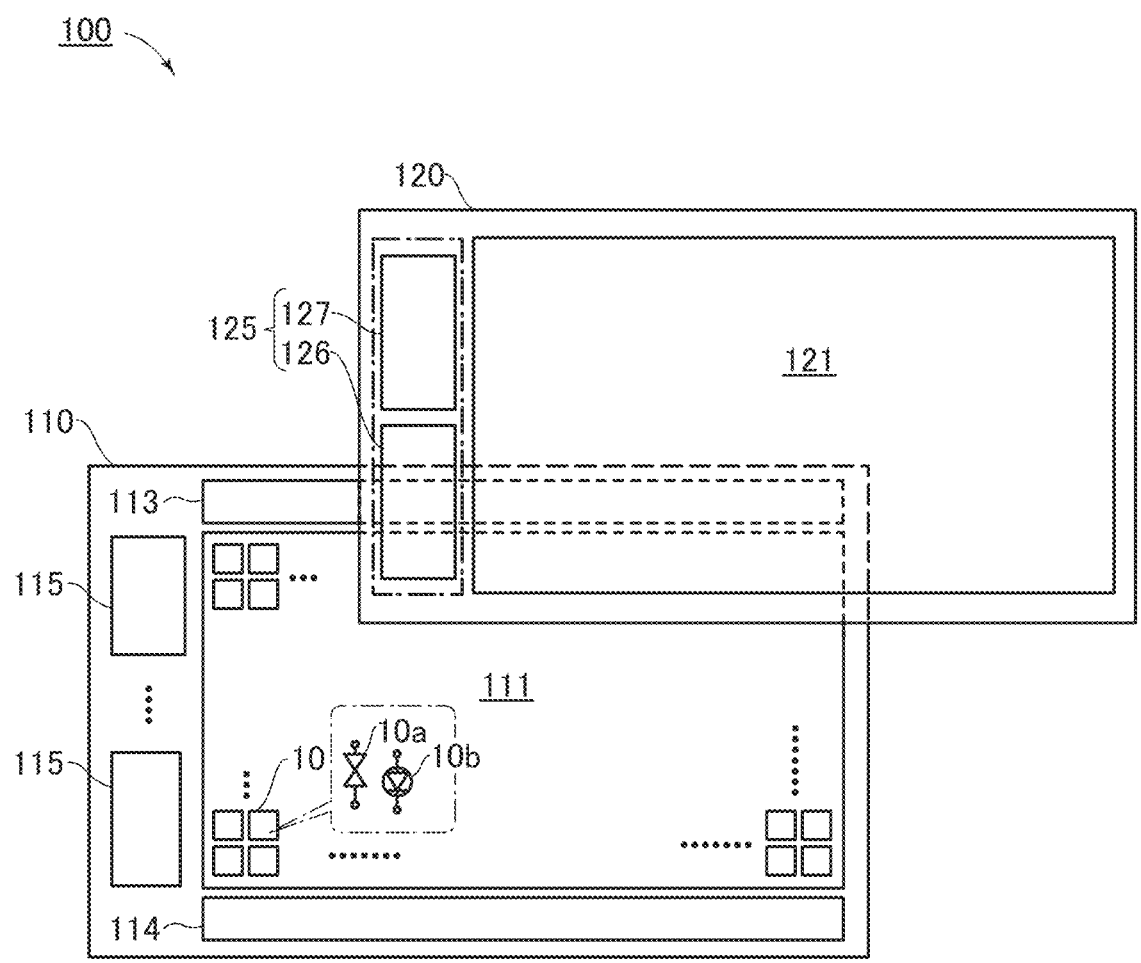
FIG. 2 illustrates a structure example of a display device.

FIG. 2 illustrates a structure example of a display device. A display device 100 includes a display unit 110 and a touch sensor unit 120.

<Display Unit>

The display unit 110 includes a pixel array 111, a gate driver 113, a gate driver 114, and controller ICs 115.

The pixel array 111 forms a region where images can be displayed. When the display unit 110 is incorporated into the electronic device 900, the pixel array 111 functions as the display portion 902. The pixel array 111 includes a plurality of pixels 10. Each of the pixels 10 is an active element driven by a transistor. Each of the pixels 10 includes a reflective element 10a and a light-emitting element 10b. A more specific structure example of the display unit 110 will be described in Embodiment 2.

The gate driver 113 has a function of driving a gate line for selecting the reflective element 10a. The gate driver 114 has a function of driving a gate line for selecting the light-emitting element 10b. The controller IC 115 includes a source driver that drives a source line supplying a data signal to the reflective element 10a and a source driver that drives a source line supplying a data signal to the light-emitting element 10b. The controller IC 115 has a function of collectively controlling the operation of the display device 100. The number of controller ICs 115 is determined depending on the number of pixels in the pixel array.

Although FIG. 2 illustrates an example in which the gate drivers 113 and 114 are integrated together with the pixel array 111 over the same substrate, the gate drivers 113 and 114 can be dedicated ICs. Alternatively, the gate driver 113 or the gate driver 114 may be incorporated into the controller IC 115.

The controller IC 115 is mounted by a chip on glass (COG) method here; however, there is no particular limitation on the mounting method. A chip on flexible (COF) method, a tape automated bonding (TAB) method, or the like may be employed. The same applies to a method for mounting an IC on the touch sensor unit 120.

A transistor used for the pixel 10 is an OS transistor, which has a lower off-state current than a Si transistor.

The OS transistor preferably includes a metal oxide in a channel formation region. The metal oxide used for the OS transistor is preferably an oxide containing at least one of indium (In) and zinc (Zn).

Typical examples of such an oxide include In-M-Zn oxide, In-M oxide, Zn-M oxide, and In—Zn oxide (the element M is aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example). The off-state current per micrometer of channel width of an OS transistor can be low and approximately from 1 yA/μm (y: yocto, $10^{-24}$) to 1 zA/μm (z: zepto, $10^{-21}$).

A cloud-aligned composite oxide semiconductor (CAC-OS) is preferably used for an OS transistor. Note that the details of the CAC-OS will be described in Embodiment 2.

The transistor used for the pixel 10 is not necessarily an OS transistor as long as its off-state current is low. For example, a transistor including a wide-bandgap semiconductor may be used. A wide-bandgap semiconductor sometimes refers to a semiconductor with a bandgap of 2.2 eV or greater. Examples of the wide-bandgap semiconductor include silicon carbide, gallium nitride, and diamond.

By using the transistor having a low off-state current for the pixel 10, the gate drivers 113 and 114 and the source drivers can be temporarily stopped (this corresponds to "idling stop" or "IDS driving" described above) when there is no need to rewrite the display screen, that is, when a still image is displayed. Power consumption of the display device 100 can be reduced by IDS driving.

<Touch Sensor Unit>

The touch sensor unit 120 illustrated in FIG. 2 includes a sensor array 121 and a peripheral circuit 125. The peripheral circuit 125 includes a touch sensor driver (hereinafter referred to as "TS driver") 126 and a sensing circuit 127. The peripheral circuit 125 can be composed of a dedicated IC.

The sensor array 121 forms a region where data can be input with a finger, a stylus, or the like. When the touch sensor unit 120 is incorporated into the electronic device 900, the sensor array 121 functions as a touch panel in the display portion 902.

Figure 3:
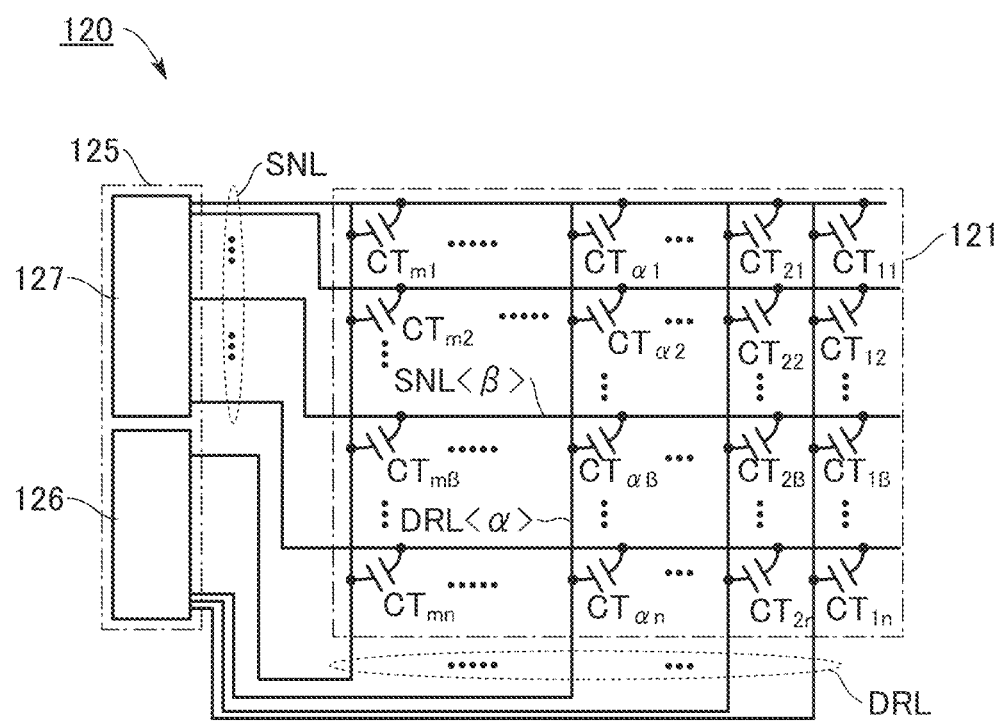
FIG. 3 illustrates a structure example of a touch sensor unit.

FIG. 3 illustrates a structure example of the touch sensor unit 120. Here, the touch sensor unit 120 is a mutual capacitive touch sensor unit as an example. The sensor array 121 includes m wirings DRL and n wirings SNL, where m is an integer of 1 or more and n is an integer of 1 or more. The wiring DRL is a driving line, and the wiring SNL is a sensing line. Here, the α-th wiring DRL (α is an integer greater of 1 to m) is referred to as a wiring DRL<α>, and the β-th wiring SNL (β is an integer of 1 to n) is referred to as a wiring SNL<β>. A capacitor $CT_{\alpha\beta}$ refers to a capacitor formed between the wiring DRL<α> and the wiring SNL<β>.

The m wirings DRL are electrically connected to the TS driver 126. The TS driver 126 has a function of driving the wirings DRL. The n wirings SNL are electrically connected to the sensing circuit 127. The sensing circuit 127 has a function of sensing signals of the wirings SNL. A signal of the wiring SNL<β> at the time when the wiring DRL<α> is driven by the TS driver 126 includes information on the amount of change in capacitance of the capacitor $CT_{\alpha\beta}$. By analyzing signals of the n wirings SNL, information on the presence or absence of touch, the touch position, and the like can be obtained.

<<Controller IC>>

Figure 4:
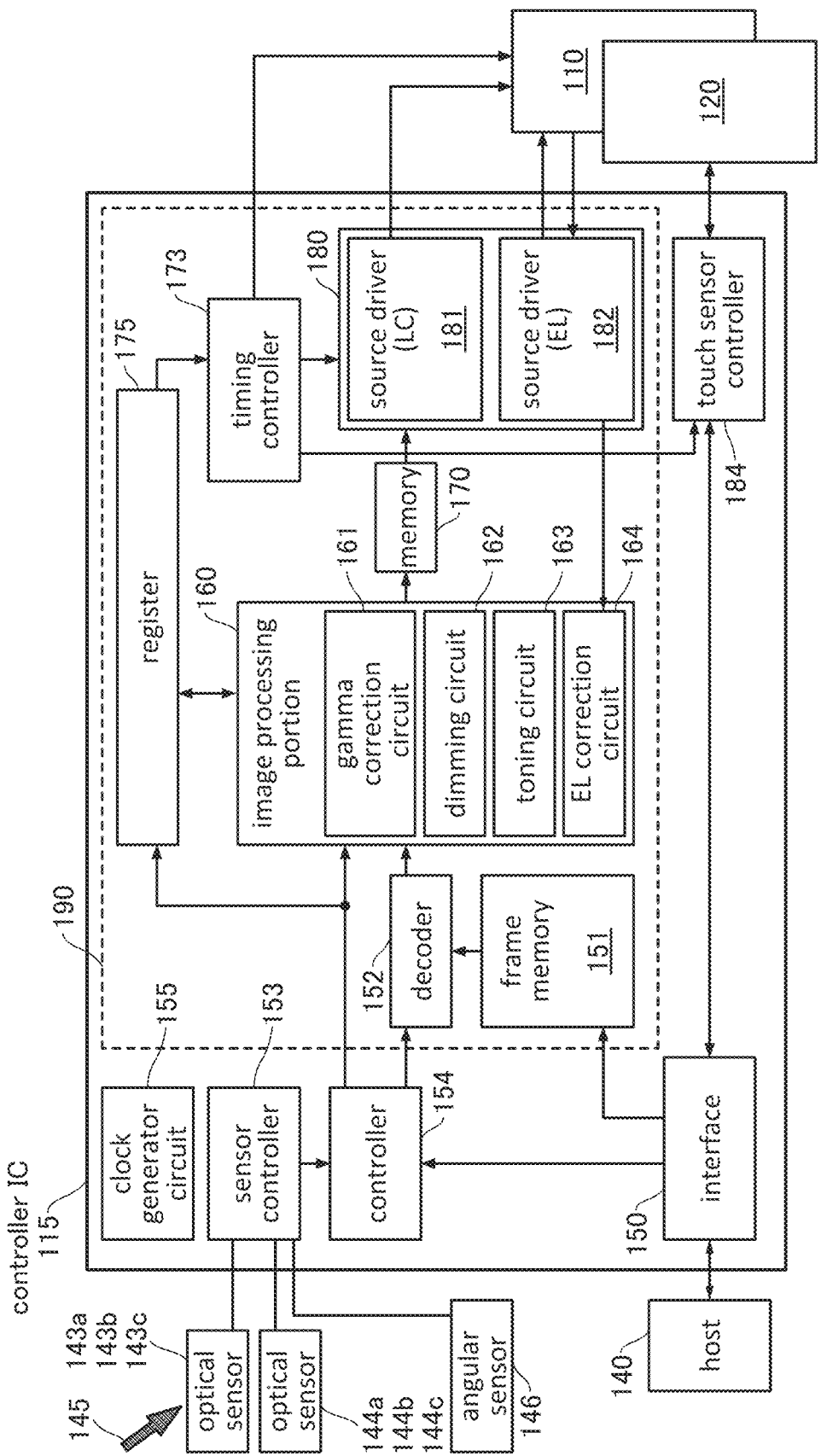
FIG. 4 is a block diagram illustrating a structure example of a controller IC.

FIG. 4 is a block diagram illustrating a structure example of the controller IC 115. The controller IC 115 includes an interface 150, a frame memory 151, a decoder 152, a sensor controller 153, a controller 154, a clock generator circuit 155, an image processing portion 160, a memory 170, a timing controller 173, a register 175, a source driver 180, and a touch sensor controller 184.

The source driver 180 includes a source driver 181 and a source driver 182. The source driver 181 is a driver for driving the reflective element 10a. The source driver 182 is a driver for driving the light-emitting element 10b. Here, the description is made on a controller IC for a liquid crystal (LC) element and an organic electroluminescent (EL) element that are used as the reflective element 10a and the light-emitting element 10b, respectively.

Communication between the controller IC 115 and a host 140 is performed through the interface 150. Image data, a variety of control signals, and the like are transmitted from the host 140 to the controller IC 115. Information on a touch position or the like obtained by the touch sensor controller 184 is transmitted from the controller IC 115 to the host 140. Note that circuits to be included in the controller IC 115 are selected as appropriate depending on the standard of the host 140, the specifications of the display device 100, and the like.

The frame memory 151 is a memory for storing image data input to the controller IC 115. When compressed image data is transmitted from the host 140, the frame memory 151 can store the compressed image data. The decoder 152 is a circuit for decompressing the compressed image data. When decompression of the image data is not needed, processing is not performed in the decoder 152. Alternatively, the decoder 152 can be provided between the frame memory 151 and the interface 150.

The image processing portion 160 has a function of performing various kinds of image processing on image data. For example, the image processing portion 160 includes a gamma correction circuit 161, a dimming circuit 162, a toning circuit 163, and an EL correction circuit 164.

The EL correction circuit 164 is provided in the case where the source driver 182 is provided with a current detection circuit that detects a current flowing through the light-emitting element 10b. The EL correction circuit 164 has a function of adjusting luminance of the light-emitting element 10b on the basis of a signal transmitted from the current detection circuit in the source driver 182.

Image data processed in the image processing portion 160 is output to the source driver 180 through the memory 170. The memory 170 is a memory for temporarily storing image data. The source driver 181 and the source driver 182 each have a function of processing the input image data and writing the image data to source lines of the pixel array 111.

The timing controller 173 has a function of generating timing signals to be used in the source driver 180, the touch sensor controller 184, and the gate drivers 113 and 114 in the display unit 110.

The touch sensor controller 184 has a function of controlling the TS driver 126 and the sensing circuit 127 in the touch sensor unit 120. A signal including touch information read from the sensing circuit 127 is processed in the touch sensor controller 184 and transmitted to the host 140 through the interface 150. The host 140 generates image data reflecting the touch information and transmits the image data to the controller IC 115. Note that it is also possible to reflect the touch information in image data by the controller IC 115.

The clock generator circuit 155 has a function of generating a clock signal used in the controller IC 115. The controller 154 has a function of processing a variety of control signals transmitted from the host 140 through the interface 150 and controlling a variety of circuits in the controller IC 115. The controller 154 also has a function of controlling power supply to the circuits in the controller IC 115. Hereinafter, temporary stop of power supply to a circuit that is not being used is referred to as power gating. Note that a clock signal, a power supply line, and the like are not shown in FIG. 4.

The register 175 stores data used for the operation of the controller IC 115. Examples of the data stored in the register 175 include a parameter used to perform correction processing in the image processing portion 160 and parameters used to generate waveforms of a variety of timing signals in the timing controller 173. The register 175 is provided with a scan chain register including a plurality of registers.

The sensor controller 153 is electrically connected to the optical sensors 143a to 143c and the optical sensors 144a to 144c. Each of the optical sensors 143a to 143c and 144a to 144c senses light 145 and generates a sensor signal. The sensor controller 153 generates a control signal on the basis of the sensor signal. The control signal generated in the sensor controller 153 is output to the controller 154, for example.

An angular sensor 146 may be electrically connected to the sensor controller 153. When the angular sensor 146 senses the angle between the housing 901a and the housing 901b in the electronic device 900 and finds that the housings are closed, power gating (described later in detail) can be performed.

Although the electronic device 900 includes six optical sensors (the optical sensors 143a to 143c and 144a to 144c) in this embodiment, one embodiment of the present invention is not limited to this. For example, one optical sensor may be provided for the first display region 905a, and another optical sensor may be provided for the second display region 905b. However, since the electronic device 900 is foldable, part of the first display region 905a or the second display region 905b is sometimes shaded depending on the angle between the housing 901a and the housing 901b. Moreover, when a user uses the electronic device 900 while supporting it with his/her hand, the light 145 may be blocked by the user's hand in some cases. Therefore, a plurality of optical sensors are preferably provided for one display region.

The image processing portion 160 has a function of separately generating image data for the reflective element 10a and image data for the light-emitting element 10b when the reflective element 10a and the light-emitting element 10b are used for displaying one image. In that case, the reflection intensity of the reflective element 10a and the emission intensity of the light-emitting element 10b can be adjusted in accordance with the brightness of the light 145 measured using the optical sensors 143a to 143c and 144a to 144c. Here, the adjustment can be referred to as dimming. In addition, a circuit that performs the dimming is referred to as a dimming circuit.

For example, when the display device 100 is used outside in the daytime on a sunny day, it is not necessary to make the light-emitting element 10b emit light if sufficient luminance is obtained only with the reflective element 10a. This is because favorable display is not obtained by using the light-emitting element 10b owing to strong external light. In contrast, when the display device 100 is used at night or in a dark place, display is performed by making the light-emitting element 10b emit light.

In response to the brightness of the light 145, the image processing portion 160 can generate image data with which display is performed only by the reflective element 10a, image data with which display is performed only by the light-emitting element 10b, or image data with which display is performed by a combination of the reflective element 10a and the light-emitting element 10b. The display device 100 can perform favorable display even in an environment with high-intensity light 145 and an environment with low-intensity light 145. Power consumption can be reduced by making the light-emitting element 10b emit no light or reducing the luminance of the light-emitting element 10b in an environment with high-intensity light 145.

Color tones can be corrected by combining the display by the light-emitting element 10b with the display by the reflective element 10a. To perform such tone correction, a function of measuring the color tones of the light 145 can be added to the optical sensors 143a to 143c and 144a to 144c and the sensor controller 153. For example, when the display device 100 is used in a reddish environment at nightfall, a blue (B) component is not sufficient only with the display by the reflective element 10a; thus, a blue (B) pixel of the light-emitting element 10b is made to emit light to correct the color tones. Here, the correction can be referred to as toning. In addition, a circuit that performs the toning is referred to as a toning circuit.

The dimming and toning may be performed with an emphasis on luminance or color tones that a user of the display device 100 sets. Note that in this embodiment, the user of the display device 100 is also the user of the electronic device 900; "user of the display device 100" and "user of the electronic device 900" are interchangeable terms.

The image processing portion 160 may include another processing circuit such as an RGB-RGBW conversion circuit, depending on the specifications of the display device 100. The RGB-RGBW conversion circuit has a function of converting image data of red, green, and blue (RGB) into image data of red, green, blue, and white (RGBW). That is, when the display device 100 includes pixels of four colors of RGBW, power consumption can be reduced by displaying a white (W) component in the image data with the use of the white (W) pixel. Note that in the case where the display device 100 includes pixels of four colors of red, green, blue, and yellow (RGBY), an RGB-RGBY conversion circuit can be used, for example.

The reflective element 10a and the light-emitting element 10b can show different image data. In general, the operating speed of liquid crystal, electronic paper, or the like that can be used for a reflective element is low in many cases (it takes time to display a picture). Thus, a still image to be a background can be displayed with the reflective element 10a, and a moving mouse pointer or the like can be displayed with the light-emitting element 10b. By performing the above IDS driving for still image display and making the light-emitting element 10b emit light for moving image display, the display device 100 can achieve display of a smooth moving image and reduction of power consumption at the same time. In that case, the frame memory 151 is provided with regions for storing image data displayed with the reflective element 10a and image data displayed with the light-emitting element 10b.

<Parameter>

Image correction processing such as gamma correction, dimming, or toning corresponds to processing for generating output correction data Y with respect to input image data X. The parameter that the image processing portion 160 uses is a parameter for converting the image data X into the correction data Y.

Figure 5A:
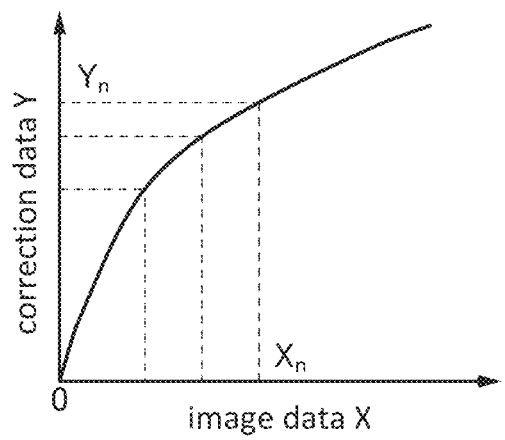
FIGS. 5A to 5C are diagrams each explaining a parameter.
Figure 5B:
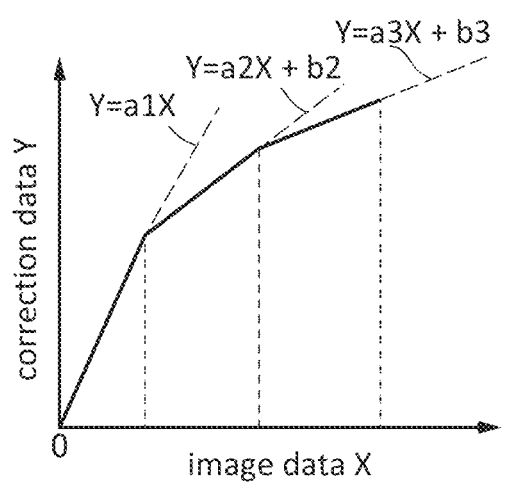

As a parameter setting method, there are a table method and a function approximation method. In a table method shown in FIG. 5A, correction data Y, with respect to image data X, is stored in a table as a parameter. In the table method, a large number of registers for storing parameters that correspond to the table is necessary; however, correction can be performed with high degree of freedom. In contrast, in the case where the correction data Y with respect to the image data X can be empirically determined in advance, a function approximation method shown in FIG. 5B is effective. Note that a1, a2, b2, and the like are parameters. Although a method of performing linear approximation in every section is shown here, a method of performing approximation with a nonlinear function can also be employed. In the function approximation method, correction is performed with low degree of freedom; however, the number of registers for storing parameters that defines a function can be small.

Figure 5C:
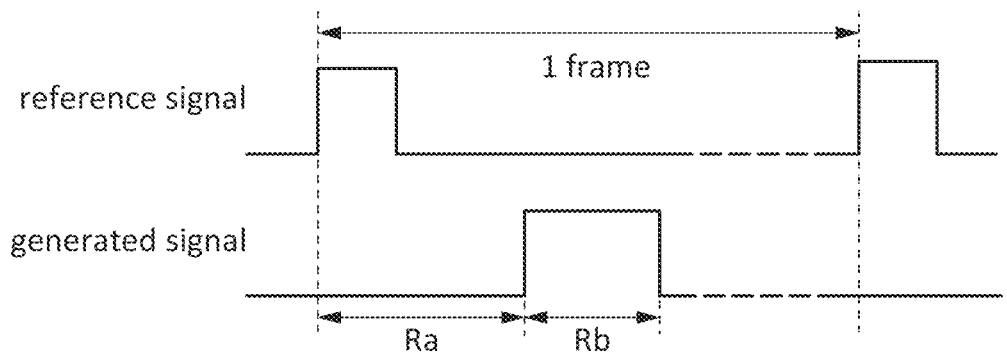

The parameter that the timing controller 173 uses indicates timing at which a signal generated by the timing controller 173 becomes "L" (or "H") with respect to a reference signal as shown in FIG. 5C. A parameter Ra (or Rb) indicates the number of clock cycles that corresponds to a time during which the generated signal is "L" (or "H") with respect to the reference signal.

The above parameter for correction can be stored in the register 175. Other parameters that can be stored in the register 175 include data of the EL correction circuit 164; luminance, color tones, and setting of energy saving (time it takes to make the display dark or turn off the display) of the display device 100 which are set by a user; sensitivity of the touch sensor controller 184; and position of the folding line 904 (range of the first display region 905a and the second display region 905b).

<Power Gating>

When image data transmitted from the host 140 is not changed, the controller 154 can perform power gating on some circuits in the controller IC 115, specifically on circuits in a region 190 (the frame memory 151, the decoder 152, the image processing portion 160, the memory 170, the timing controller 173, the register 175, and the source driver 180), for example. Power gating can be performed when a control signal that indicates no change in the image data is transmitted from the host 140 to the controller IC 115 and detected by the controller 154.

The circuits in the region 190 are the circuits related to image data and the circuits for driving the display unit 110; therefore, the circuits in the region 190 can be temporarily stopped when the image data is not changed. Note that the time during which the transistor used for the pixel 10 can store data (time during which IDS driving can be carried out) may be considered even when the image data is not changed. For example, the controller 154 may be incorporated with a timer function so as to determine timing at which power supply to the circuits in the region 190 is restarted, on the basis of time measured by a timer.

Specific circuit configurations of the frame memory 151 and the register 175 will be described below. Note that the circuits in the region 190 and the like, which can be power-gated, are not limited to those described above. A variety of combinations can be considered depending on the configuration of the controller IC 115, the standard of the host 140, the specifications of the display device 100, and the like.

<Frame Memory 151>

Figure 6:
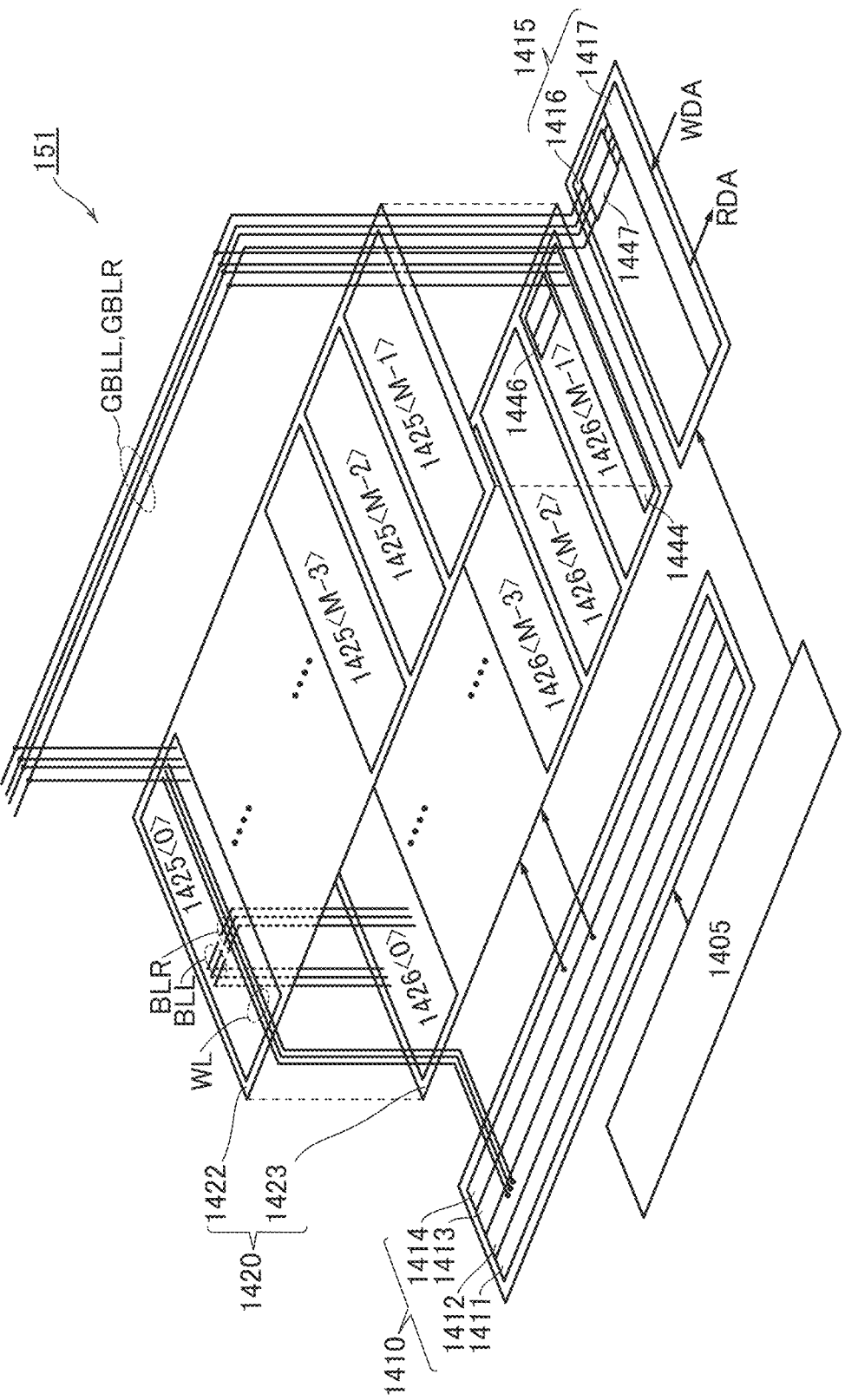
FIG. 6 is a block diagrams illustrating a structure example of a frame memory.
Figure 7A:
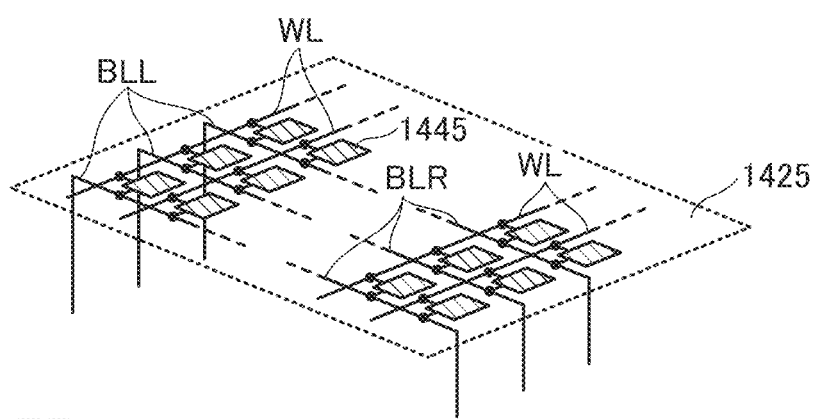
FIG. 7A is a block diagram illustrating a structure example of a memory cell array.

A structure example of the frame memory 151 will be described with reference to FIG. 6 and FIGS. 7A and 7B.

The frame memory 151 includes a controller 1405, a row circuit 1410, a column circuit 1415, and a memory cell and sense amplifier array (hereinafter referred to as MC-SA array) 1420.

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The frame memory 151 adopts a hierarchical bit line architecture, where the bit lines are separated into local bit lines and global bit lines.

The memory cell array 1422 includes M local memory cell arrays 1425<0> to 1425<M−1>, where M is an integer of 2 or more. FIG. 7A illustrates a structure example of the local memory cell array 1425. The local memory cell array 1425 includes a plurality of memory cells 1445, a plurality of word lines WL, and a plurality of bit lines BLL and BLR. In the example of FIG. 7A, the local memory cell array 1425 has an open bit-line architecture but may have a folded bit-line architecture.

Figure 7B:
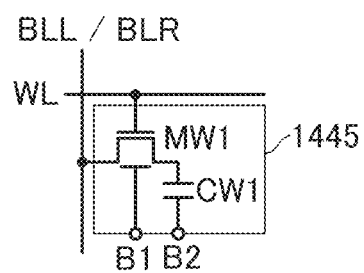
FIG. 7B is a circuit diagram illustrating a configuration example of a memory cell.

FIG. 7B illustrates a circuit configuration example of the memory cell 1445. The memory cell 1445 includes a transistor MW1, a capacitor CW1, and nodes B1 and B2. The transistor MW1 has a function of controlling charging and discharging of the capacitor CW1. A gate of the transistor MW1 is electrically connected to the word line WL, a first terminal of the transistor MW1 is electrically connected to the bit line BLL (or BLR), and a second terminal of the transistor MW1 is electrically connected to a first terminal of the capacitor CW1. A second terminal of the capacitor CW1 is electrically connected to the node B2. A constant voltage (e.g., a low power supply voltage) is input to the node B2.

The transistor MW1 has a back gate that is electrically connected to the node B1. This makes it possible to change the threshold voltage of the transistor MW1 with the voltage of the node B1. For example, the voltage of the node B1 may be a fixed voltage (e.g., a negative constant voltage) or may be changed in response to the operation of the frame memory 151.

Note that the back gate of the transistor MW1 may be electrically connected to the gate, the source, or the drain of the transistor MW1. Alternatively, the transistor MW1 is not necessarily provided with a back gate.

Owing to an extremely low off-state current of an OS transistor, the use of the OS transistor in the memory cell 1445 can inhibit leakage of charge from the capacitor CW1; thus, the frequency of refresh operations of the frame memory 151 can be reduced. The frame memory 151 can retain image data for a long time even when power supply is stopped. Moreover, by inputting a negative potential to the node B1, the threshold voltage of the transistor MW1 can be shifted positively, and thus the retention time of the memory cell 1445 can be increased.

Here, an off-state current refers to a current that flows between a source and a drain of a transistor in an off state. In an n-channel transistor, for example, when the threshold voltage of the transistor is approximately 0 V to 2 V, an off-state current can refer to a current flowing between a source and a drain when a voltage of a gate with respect to the source is negative. An "extremely low" off-state current means that, for example, an off-state current per micrometer of channel width is lower than or equal to 100 zA (z represents zepto and denotes a factor of $10^{-21}$). Since the off-state current is preferably as low as possible, the normalized off-state current is preferably lower than or equal to 10 zA/μm or lower than or equal to 1 zA/μm, further preferably lower than or equal to 10 yA/μm (y represents yocto and denotes a factor of $10^{-24}$).

The sense amplifier array 1423 includes M local sense amplifier arrays 1426<0> to 1426<M−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference between the bit line pair, and a function of retaining the voltage difference. The switch array 1444 has a function of selecting a bit line pair and establishing electrical continuity between the selected bit line pair and a global bit line pair.

Here, a bit line pair refers to two bit lines that are compared by a sense amplifier at the same time. A global bit line pair refers to two global bit lines that are compared by a global sense amplifier at the same time. A bit line pair can be referred to as a pair of bit lines, and a global bit line pair can be referred to as a pair of global bit lines. Here, the bit line BLL and the bit line BLR form one bit line pair, and the global bit line GBLL and the global bit line GBLR form one global bit line pair. In the description hereinafter, the expressions "bit line pair (BLL, BLR)" and "global bit line pair (GBLL, GBLR)" are also used.

(Controller 1405)

The controller 1405 has a function of controlling the overall operation of the frame memory 151. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. The selection signal from the column selector 1413 controls the switch array 1444 of each local sense amplifier array 1426. The control signals from the sense amplifier driver circuit 1414 drive each of the local sense amplifier arrays 1426 independently.

(Column Circuit 1415)

The column circuit 1415 has a function of controlling input of data WDA and a function of controlling output of data RDA. The data WDA is a write data signal, and the data RDA is a read data signal.

The global sense amplifier 1447 is electrically connected to the global bit line pair (GBLL, GBLR). The global sense amplifier 1447 has a function of amplifying a voltage difference between the global bit line pair (GBLL, GBLR) and a function of retaining the voltage difference. The input/output circuit 1417 writes and reads data to and from the global bit line pair (GBLL, GBLR).

Write operation of the frame memory 151 is briefly described. Data are written to the global bit line pair (GBLL, GBLR) by the input/output circuit 1417. The data of the global bit line pair (GBLL, GBLR) are retained by the global sense amplifier array 1416. By the switch array 1444 of the local sense amplifier array 1426 specified by an address signal, the data of the global bit line pair are written to the bit line pair (BLL, BLR) of the column subjected to data writing. The local sense amplifier array 1426 amplifies the written data and retains the amplified data. In the specified local memory cell array 1425, the word line WL of the row subjected to data writing is selected by the row circuit 1410, and the data retained in the local sense amplifier array 1426 is written to the memory cell 1445 of the selected row.

Read operation of the frame memory 151 is briefly described. One row of the local memory cell array 1425 is specified with an address signal. In the specified local memory cell array 1425, the word line WL of the row subjected to data reading is selected, and data of the memory cell 1445 is written to the bit line BLL (or BLR). The local sense amplifier array 1426 detects a voltage difference between the bit line pair (BLL, BLR) of each column as data, and retains the data. The switch array 1444 writes the data of a column specified by the address signal to the global bit line pair (GBLL, GBLR); the data is chosen from the data retained in the local sense amplifier array 1426. The global sense amplifier array 1416 detects and retains the data of the global bit line pair (GBLL, GBLR). The data retained in the global sense amplifier array 1416 is output to the input/output circuit 1417. Thus, the read operation is completed.

Data is rewritten by charging and discharging of the capacitor CW1; hence, there is theoretically no limitation on rewrite cycles of the frame memory 151, and data can be written to and read from the frame memory 151 with low energy. Owing to a simple circuit configuration of the memory cell 1445, the capacity of the frame memory 151 can be easily increased.

The transistor MW1 is an OS transistor. The extremely low off-state current of the OS transistor can inhibit leakage of charge from the capacitor CW1. Thus, the retention time of the frame memory 151 is considerably longer than that of DRAM. Accordingly, backup operation for the frame memory 151 is not necessarily carried out when the controller IC 115 is power-gated.

The frequency of refresh operations of the frame memory 151 can be reduced while the controller IC 115 is in normal operation; hence, power necessary for the refresh operations can be decreased. This leads to a reduction in power consumption of the controller IC 115 in normal operation.

The MC-SA array 1420 having the stacked-layer structure enables the circuit area of the frame memory 151 to be reduced, leading to a smaller size of the controller IC 115.

Since the MC-SA array 1420 has the stacked-layer structure, the bit line can be shortened to a length that is close to the length of the local sense amplifier array 1426. A shorter bit line results in a smaller bit line capacitance, which can reduce the storage capacitance of the memory cell 1445. In addition, providing the switch array 1444 in the local sense amplifier array 1426 allows the number of long bit lines to be reduced. For the reasons described above, a load to be driven during access to the frame memory 151 is reduced, resulting in a reduction in energy consumption of the controller IC 115.

<Register 175>

A structure example and an operation example of the register 175 will be described with reference to FIGS. 8 to 11.

Figure 8:
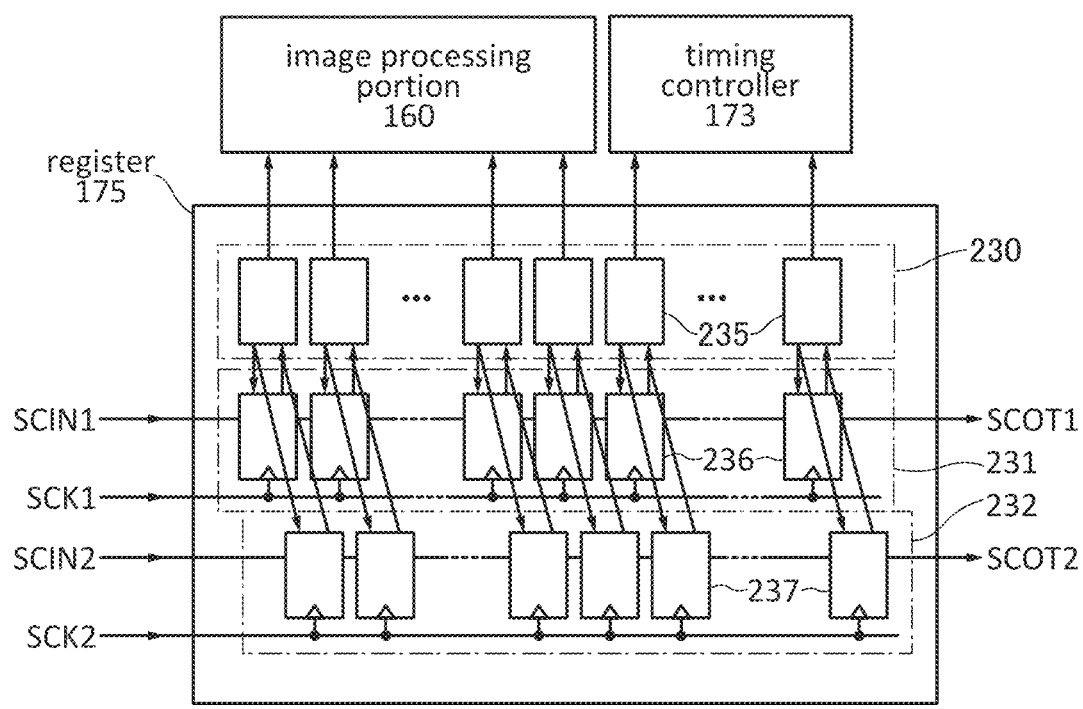
FIG. 8 is a block diagram illustrating a structure example of a register.

FIG. 8 is a block diagram illustrating a structure example of the register 175. The register 175 includes a register portion 230 and scan chain register portions 231 and 232. The scan chain register portion 231 mainly stores data related to the first display region 905*a*. The scan chain register portion 232 mainly stores data related to the second display region 905*b*.

The register portion 230 includes a plurality of registers 235. The scan chain register portion 231 includes a plurality of registers 236 and nodes SCIN1 and SCOT1. The scan chain register portion 232 includes a plurality of registers 237 and nodes SCIN2 and SCOT2.

The registers 236 and 237 are nonvolatile registers, which do not lose data even when power supply is stopped. Each of the registers 236 and 237 is provided with a retention circuit including an OS transistor to be nonvolatile.

Meanwhile, the register 235 is a volatile register. There is no particular limitation on the circuit configuration of the register 235; the register 235 can be any circuit capable of storing data and is composed of a latch circuit, a flip-flop circuit, or the like. The image processing portion 160 and the timing controller 173 access the register portion 230 and take data from the corresponding register 235. Alternatively, the processing details of the image processing portion 160 and the timing controller 173 are controlled in accordance with data supplied from the register portion 230.

To update data stored in the register 175, first, data in the scan chain register portions 231 and 232 are changed. To change data in the scan chain register portion 231, data is input from the node SCIN1 while a scan clock signal SCK1 is toggled. By the data input from the node SCIN1, data in each register 236 is updated in accordance with the scan clock signal SCK1. The last-stage register 236 outputs data from the node SCOT1. Similarly, to change data in the scan chain register portion 232, data is input from the node SCIN2 while a scan clock signal SCK2 is toggled. By the data input from the node SCIN2, data in each register 237 is updated in accordance with the scan clock signal SCK2. The last-stage register 237 outputs data from the node SCOT2.

Here, the data input from the node SCIN1 or the node SCIN2 is, for example, data that is set by a manufacturer of the electronic device 900 or the display device 100 and transmitted from the host 140, data that is set by the user of the electronic device 900 and transmitted from the host 140, or data that corresponds to a control signal generated in the sensor controller 153 and is transmitted from the controller 154.

After the data of each register 236 in the scan chain register portion 231 is rewritten, the data of the registers 236 are collectively loaded into the corresponding registers 235 in the register portion 230. Alternatively, after the data of each register 237 in the scan chain register portion 232 is rewritten, the data of the registers 237 are collectively loaded into the corresponding registers 235 in the register portion 230

The image processing portion 160 needs data in the scan chain register portion 231 when processing image data to be shown on the first display region 905*a*, and needs data in the scan chain register portion 232 when processing image data to be shown on the second display region 905*b*. In such a case, data in the scan chain register portion 231 or data in the scan chain register portion 232 is loaded into the register portion 230 regardless of whether data in the scan chain register portion 231 or the scan chain register portion 232 is changed or not.

Accordingly, the image processing portion 160, the timing controller 173, and the like can perform various kinds of processing by using the collectively updated data. The operation of the controller IC 115 can be stable because simultaneity in data update is maintained. By including the scan chain register portions 231 and 232 and the register portion 230, the register 175 can update data in the scan chain register portions 231 and 232 even while the image processing portion 160 and the timing controller 173 are in operation.

When the controller IC 115 is power-gated, power supply is stopped after data is stored (saved) in the retention circuit of the registers 236 and 237. After the power supply is restored, normal operation is restarted after the data in the register 236 or the register 237 is restored (loaded) to the register 235. Note that in the case where the data stored in the register 236 or the register 237 and the data stored in the register 235 do not match each other, it is preferable to save the data of the register 235 in the register 236 or the register 237 and then store the data again in the retention circuit of the registers 236 and 237. When the above data do not match, data in the scan chain register portions 231 and 232 may have been changed, for example.

Figure 9:
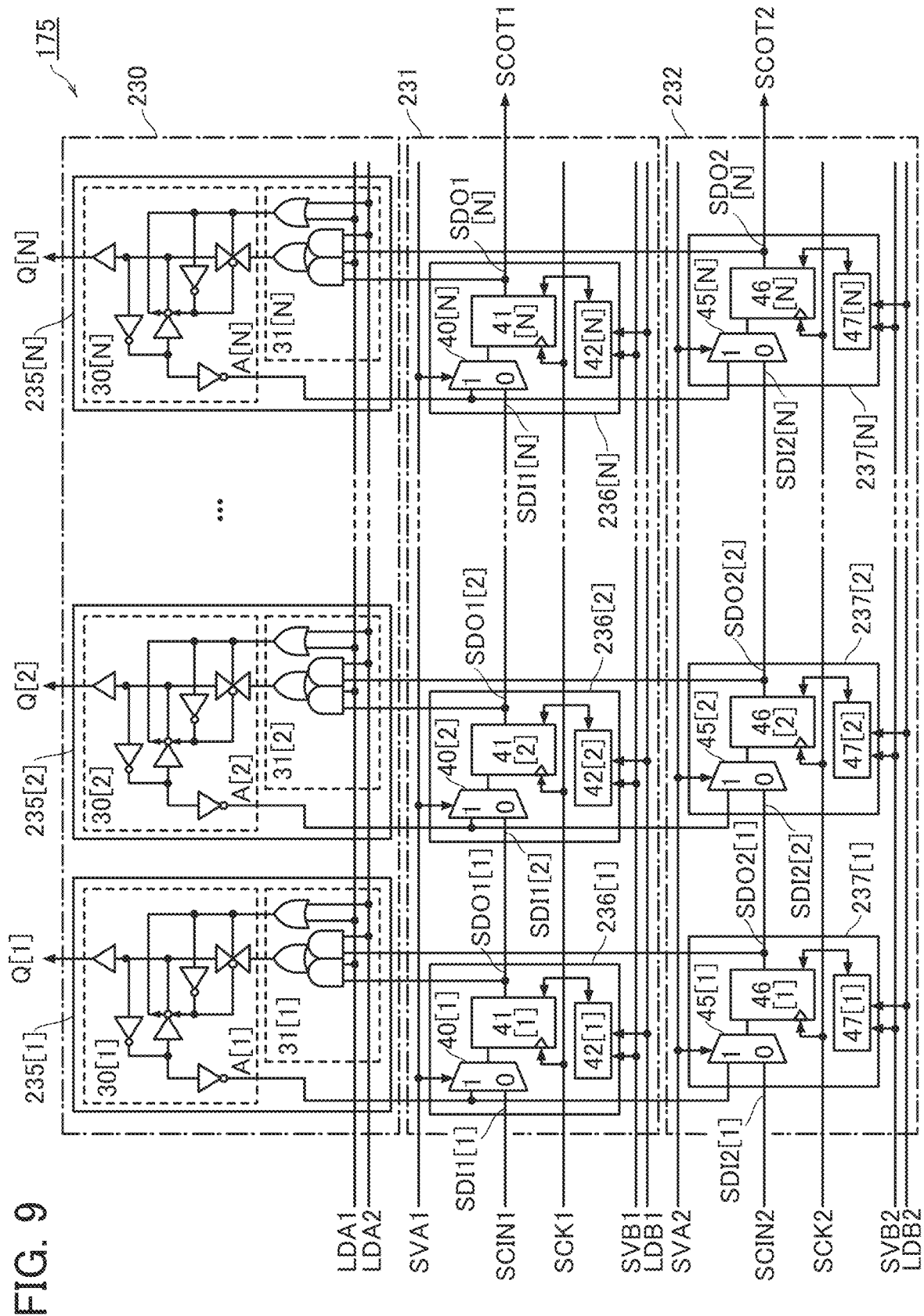
FIG. 9 is a circuit diagram illustrating a configuration example of a register.

A circuit configuration example of the register 175 will be described with reference to FIG. 9 and FIG. 10.

The register portion 230 includes N registers 235 (N is an integer of 2 or more). Signals LDA1 and LDA2 are input to the register portion 230. The signals LDA1 and LDA2 are signals for controlling data loading.

The scan chain register portion 231 includes N registers 236, and the scan chain register portion 232 includes N registers 237. The scan clock signal SCK1 and signals SVA1, SVB1, and LDB1 are input to the scan chain register portion 231. The scan clock signal SCK2 and signals SVA2, SVB2, and LDB2 are input to the scan chain register portion 232. The signals LDB1 and LDB2 are signals for controlling data loading. The signals SVA1, SVA2, SVB1, and SVB2 are signals for controlling data saving.

Note that in this specification, when it is necessary to specify one of the plurality of registers 235, the term "register 235[1]" or the like is employed. Moreover, the term "register 235" refers to a given register 235. The same applies to other components.

The register 235 includes a latch circuit 30 and a multiplexer (MUX) 31. The register 236 includes a selector 40, a flip-flop circuit 41, a retention circuit 42, and nodes SDI1 and SDO1. The register 237 includes a selector 45, a flip-flop circuit 46, a retention circuit 47, and nodes SDI2 and SDO2. The nodes SDI1 and SDI2 are nodes to which data is input. The nodes SDO1 and SDO2 are nodes from which data is output.

<Register 235>

The register 235 is a volatile register. Nodes Q and A are output nodes of the latch circuit 30 and output data with the same logic. The node Q is electrically connected to the image processing portion 160, the timing controller 173, or the like. The node A is electrically connected to the registers 236 and 237. There is no particular limitation on the latch circuit 30, and another circuit such as a flip-flop circuit may be provided.

The MUX 31 has a function of selecting data to be input to the latch circuit 30. The signals LDA1 and LDA2 are control signals for the MUX 31. In the example of FIG. 9, data in the latch circuit 30 is updated by data of the node SDO1 when the signal LDA1 is "H" and the signal LDA2 is "L." On the other hand, when the signal LDA1 is "L" and the signal LDA2 is "H," data in the latch circuit 30 is updated by data of the node SDO2.

The registers 236 and 237 are nonvolatile registers. A more specific circuit configuration example of the registers 236 and 237 will be described with reference to FIG. 10.

<Register 236>

In the register 236, the selector 40 and the flip-flop circuit 41 constitute a scan flip-flop circuit. When the scan chain register portion 231 operates as a shift register, the register 236 takes data from the node SDI1 and outputs the data from the node SDO1. The data of the node SDO1 is input to the node SDI1 in the next-stage register 236.

The signal SVA1 is a control signal for the selector 40. When the signal SVA1 is "H," the selector 40 establishes electrical continuity between an input node of the flip-flop circuit 41 and the node A in the register 235. When the signal SVA1 is "L," the selector 40 establishes electrical continuity between the input node of the flip-flop circuit 41 and the node SDI1.

Figure 10:
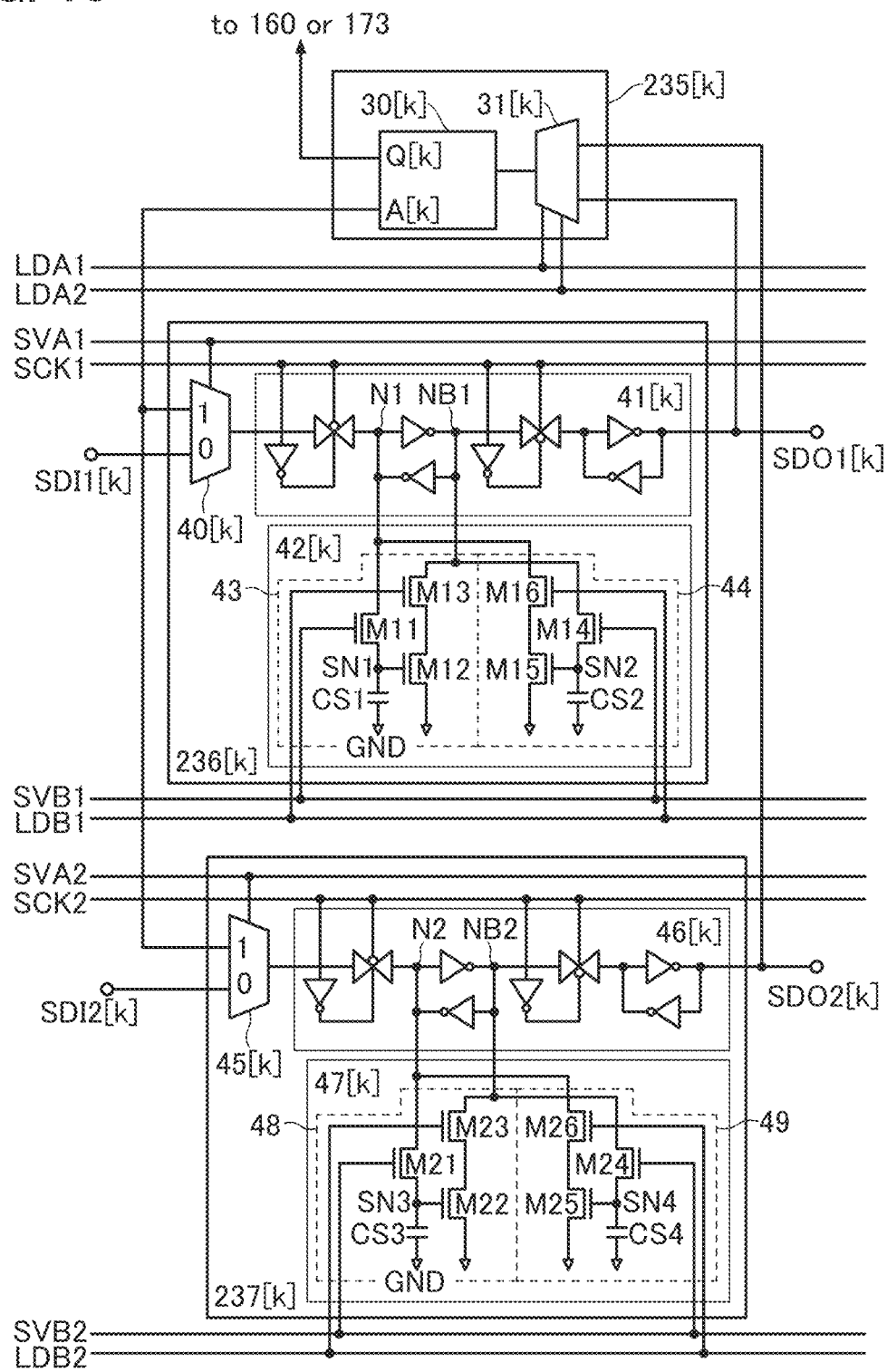
FIG. 10 is a circuit diagram illustrating a configuration example of a register.

The flip-flop circuit 41 is not limited to having the circuit configuration in FIG. 10 and can be any of a variety of flip-flop circuits. The retention circuit 42 is electrically connected to nodes N1 and NB1 in the flip-flop circuit 41. The signals LDB1 and SVB1 are control signals for the retention circuit 42.

The retention circuit 42 is a circuit for storing data retained in the flip-flop circuit 41 and includes two memory circuits 43 and 44. Here, each of the memory circuits 43 and 44 is composed of a three-transistor gain cell. The memory circuit 43 includes transistors M11 to M13, a capacitor CS1, and a node SN1. The memory circuit 44 includes transistors M14 to M16, a capacitor CS2, and a node SN2. The nodes SN1 and SN2 are retention nodes of the respective memory circuits 43 and 44.

The memory circuit 43 has a function of backing up data of the node N1 and loading the backed-up data into the node NB1. The memory circuit 44 has a function of backing up data of the node NB1 and loading the backed-up data into the node N1. In accordance with the signal SVB1, the memory circuit 43 writes data of the node N1 to the node SN1 and the memory circuit 44 writes data of the node NB1 to the node SN2. In accordance with the signal LDB1, the memory circuit 43 writes data of the node SN1 to the node NB1 and the memory circuit 44 writes data of the node SN2 to the node N1.

The transistors M11 and M14 are OS transistors; thus, the retention circuit 42 can retain data for a long time even when power supply is stopped. In the register 236, the transistors other than the transistors M11 and M14 may be Si transistors.

<Register 237>

The circuit configuration of the register 237 is similar to that of the register 236; therefore, the description of the register 236 can be referred to for the details of the register 237.

In the register 237, the selector 45 and the flip-flop circuit 46 constitute a scan flip-flop circuit. The selector 45 selects one of the node A and the node SDI2 in accordance with the signal SVA2, and establishes electrical continuity between the selected node and an input node of the flip-flop circuit 46.

The retention circuit 47 is electrically connected to nodes N2 and NB2 in the flip-flop circuit 46. The retention circuit 47 includes memory circuits 48 and 49. The memory circuit 48 includes transistors M21 to M23, a capacitor CS3, and a node SN3. The memory circuit 49 includes transistors M24 to M26, a capacitor CS4, and a node SN4. The memory circuit 48 stores data of the flip-flop circuit 46 in accordance with the signal SVB2, and loads the retained data into the flip-flop circuit 46 in accordance with the signal LDB2.

The transistors M21 and M24 are OS transistors; thus, the retention circuit 47 can retain data for a long time even when power supply is stopped. Like the transistor MW1 (FIG. 7B), the transistors M21 and M24 may have a back gate. The same applies to the transistors M11 and M14.

In the register 237, the transistors other than the transistors M21 and M24 may be Si transistors.

Note that FIG. 10 shows an example in which the retention circuit 47 backs up complementary data of one inverter loop (closer to the input node) in the flip-flop circuit 46. The retention circuit 47 may be provided so as to back up complementary data of the next inverter loop (closer to the output node) in the flip-flop circuit 46. The same applies to the register 236. The retention circuits 42 and 47 having such a configuration enable asynchronous loading of backed-up data, resulting in high-speed data loading. Thus, the time it takes to restore the power-gated controller IC 115 to a normal operation state from a power-off state can be shortened.

<Operation Example of Register 175>

Figure 11:
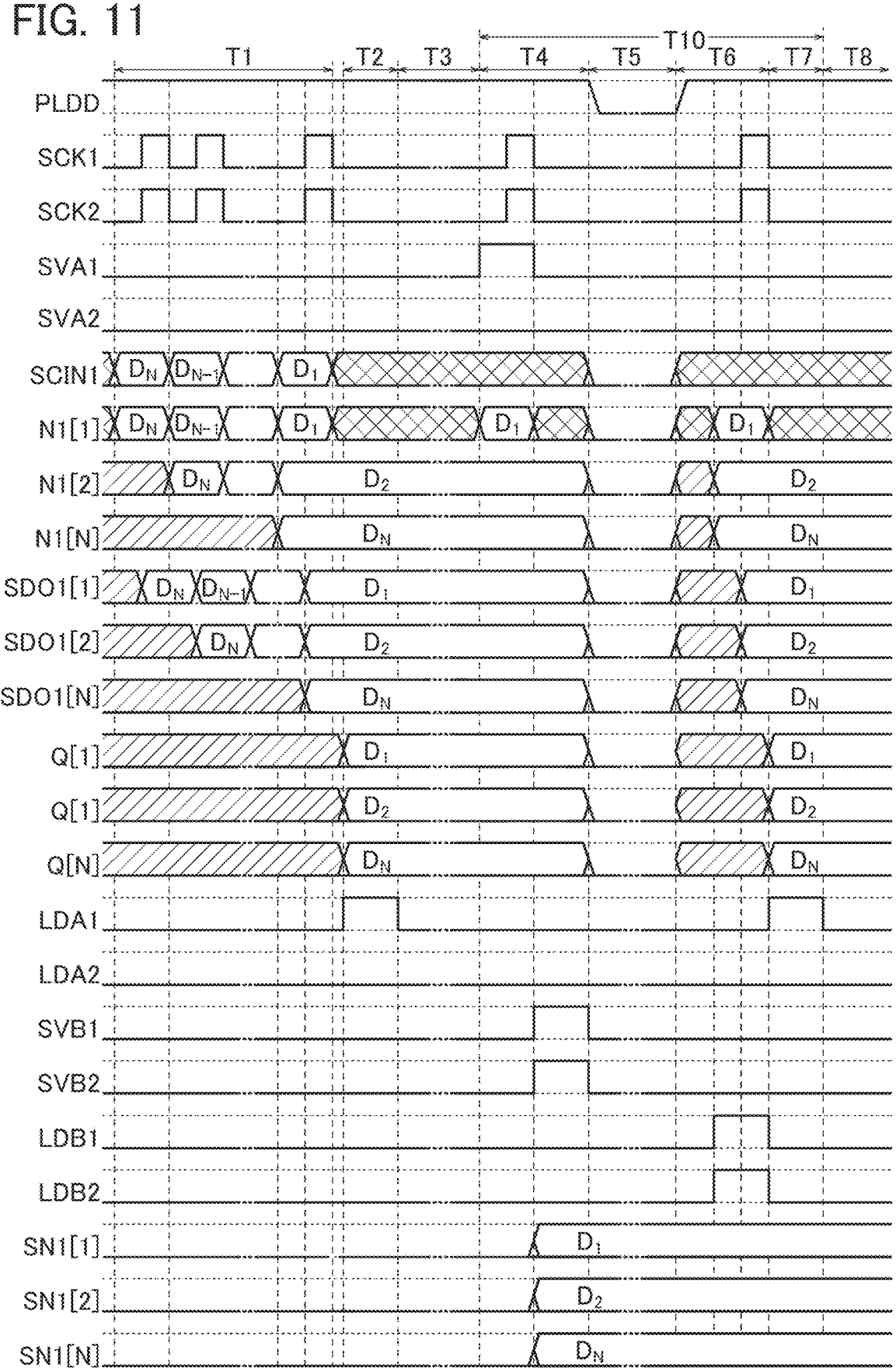
FIG. 11 is a timing chart showing an operation example of a register.

An operation example of the register 175 will be described with reference to FIG. 11. FIG. 11 is a timing chart showing an operation example of the register 175. In FIG. 11, T1, T2, and the like represents periods, and PLDD refers to a wiring that supplies a potential VDD to the register 175. The potential VDD is a power supply potential. A hatched portion of a waveform pattern for the node N1 and the like denotes that the logic is undefined (the logic is not determined to be "H" or "L").

In the period T1, the scan chain register portions 231 and 232 perform scan operation, and data is written to each of the scan chain register portions 231 and 232. In this period, the signals SVA1 and SVA2 are "L," and the scan clock signals SCK1 and SCK2 are active. Thus, electrical continuity between the node SDI' and the input node of the flip-flop circuit 41 is established by the selector 40, and electrical continuity between the node SDI2 and the input node of the flip-flop circuit 46 is established by the selector 45.

To write data to the N registers 236 in the scan chain register portion 231, data of the node SCIN1 is updated in synchronization with the scan clock signal SCK1. In the register 236[$k$] ($k$ is an integer of 1 to N), data of the node SDO1[$k$] is updated in synchronization with the rising edge of the scan clock signal SCK1, and data of the node N1[$k+1$] is updated by the data of the node SDO1[$k$] in synchronization with the falling edge of the scan clock signal SCK1. As the scan clock signal SCK1 is repeatedly toggled, data of the node SCIN1 is shifted within the registers 236.

Shift operation of the scan chain register portion 232 is performed in a similar manner to that of the scan chain register portion 231. Data of the node SDO2 is updated in synchronization with the rising edge of the scan clock signal SCK2.

In the period T2, data in the register portion 230 is updated. The signal LDA1 changes to "H," whereby electrical continuity between the node SDO1[$k$] and an input node of the latch circuit 30[$k$] is established by the MUX 31[$k$]. The latch circuit 30[$k$] stores data $D_k$ that is retained in the register 236[$k$]. The data $D_k$ is output from the nodes Q[$k$] and A[$k$]. In other words, by setting the signal LDA1 to "H," data $D_1$ to data $D_N$ retained in the scan chain register portion 231 are collectively loaded into the register portion 230. Accordingly, parameters and the like used in the image processing portion 160 and the timing controller 173 can be collectively changed.

In order to update data in the register portion 230 by data retained in the scan chain register portion 232, the signal LDA2 is set to "H" while the signal LDA1 is kept at "L."

In the period T2, electrical continuity is established between the node N1[1] and the node SCIN1 when the scan clock signal SCK1 and the signal SVA1 become "L"; hence, the potential of the node N1[1] changes in accordance with the potential of the node SCIN1. Similarly, when the scan clock signal SCK2 and the signal SVA2 become "L," the potential of the node N2[1] changes in accordance with the potential of the node SCIN2.

In a period T3, the register 175 operates normally. The data $D_1$ to data $D_N$, which are written in the period T2, are output from the nodes Q[1] to Q[N]. In this period, the scan chain register portion 231 may perform scan operation to change data in the scan chain register portion 231. After data in the scan chain register portion 231 is changed, data in the register portion 230 may be rewritten by setting the signal LDA1 to "H." The same applies to the scan chain register portion 232.

In a period T10, power gating operation is performed. The power gating operation is broadly divided into backup operation for the register 175, operation of turning off power, and recovery operation for the register 175.

In a period T4, the backup operation for the register 175 is performed. First, the signal SVA1 is set to "H," and then the scan clock signal SCK1 is set to "H"; hence, the data $D_1$ to data $D_N$ stored in the register portion 230 are written to the flip-flop circuit 41 in the scan chain register portion 231. In the example of FIG. 11, the scan clock signal SCK2 is set to "H" together with the scan clock signal SCK1 to simplify signal control; however, the scan clock signal SCK2 may be kept at "L."

By setting the signal SVA1 to "H," the selector 40 establishes electrical continuity between the node A of the latch circuit 30 and the input node of the flip-flop circuit 41. When the scan clock signal SCK1 is "L," data of the node A is written to the node N1 of the flip-flop circuit 41. When the scan clock signal SCK1 changes to "H," electrical continuity between the node N1 and the node A is broken, and electrical continuity between the node N1[1] and the node SCIN1 is broken.

Note that in the case where data stored in the register portion 230 is data loaded from the scan chain register portion 232, the data in the register portion 230 is backed up in the scan chain register portion 232. In this case, the signal SVA2 is set to "H," and then the scan clock signal SCK2 is set to "H."

Next, backup operation for the scan chain register portions 231 and 232 is performed. During the operation, the signals SVB1 and SVB2 are set to "H." When the signal SVB1 becomes "H," data of the nodes N1 and NB1 in the flip-flop circuit 41 are written to the nodes SN1 and SN2 in the retention circuit 42. When the signal SVB2 becomes "H," data of the nodes N1 and NB1 in the flip-flop circuit 46 are written to the nodes SN3 and SN4 in the retention circuit 47.

By setting the signals SVB1 and SVB2 to "L," the backup operation for the register 175 is completed.

In a period T5, the operation of turning off power is conducted. Specifically, supply of the potential VDD to the wiring PLDD is stopped. The wiring PLDD is gradually discharged. Since the potential of the wiring PLDD decreases, data in the latch circuit 30 and the flip-flop circuits 41 and 46 are lost; however, data in the retention circuits 42 and 47 are not lost.

In a period T6, recovery operation for the scan chain register portions 231 and 232 is carried out. First, supply of the potential VDD to the wiring PLDD is started. The potential of the wiring PLDD increases and then becomes the potential VDD.

Next, the signals LDB1 and LDB2 are set to "H," and one clock of the scan clock signal SCK1 and one clock of the scan clock signal SCK2 are input. When the signal LDB1 becomes "H," the retention circuit 42 writes data of the nodes SN1 and SN2 to the nodes N1 and NB1 in the flip-flop circuit 41. The data of the node N1 is input to the node SDO1 in synchronization with the rising edge of the scan clock signal SCK1. When the signal LDB2 becomes "H," the retention circuit 47 writes data of the nodes SN3 and SN4 to the nodes N2 and NB2 in the flip-flop circuit 46. The data of the node N2 is input to the node SDO2 in synchronization with the rising edge of the scan clock signal SCK2.

By setting the signals LDB1 and LDB2 to "L," the recovery operation is completed.

In a period T7, recovery operation for the register portion 230 is performed. The signal LDA1 is set to "H" to restore the register portion 230 to the state in the period T3. The recovery operation in the period T7 is the same as the operation of updating data in the register portion 230 in the period T3; thus, the data $D_1$ to data $D_N$ retained in the scan chain register portion 231 are collectively loaded into the register portion 230. By setting the signal LDA1 to "L," the recovery operation is completed.

In a period T8, the register 175 operates normally and outputs the data $D_1$ to data $D_N$, which are written in the period T7, from the nodes Q[1] to Q[N].

Operation Example

Operation examples of the controller IC 115 and the register 175 of the display device 100 before shipment, at boot-up of an electronic device including the display device 100, and at normal operation will be described separately.

<Before Shipment>

Before shipment, parameters related to the specifications and the like of the display device 100 are stored in the register 175. The parameters include, for example, the number of pixels, the number of touch sensors, parameters used to generate waveforms of a variety of timing signals in the timing controller 173, the position of the folding line 904 (range of the first display region 905a and the second display region 905b), and correction data for the EL correction circuit 164 in the case where the source driver 180 is provided with the current detection circuit for detecting a current flowing through the pixel 10. These parameters may be stored in a dedicated ROM that is additionally provided, other than in the register 175.

<At Boot-Up>

When the electronic device 900 including the display device 100 is activated, parameters set by the user are transmitted from the host 140 and stored in the register 175. These parameters include, for example, luminance and color tones of the display, sensitivity of a touch sensor, setting of energy saving (time it takes to make the display dark or turn off the display), and a curve or a table for gamma correction. Note that in storing the parameters in the register 175, a scan clock signal and data that synchronizes with the scan clock signal and corresponds to the parameters are transmitted from the controller 154 to the register 175.

<Normal Operation>

In normal operation, when the user changes settings, a parameter is transmitted from the host 140 and stored in the register 175. The parameter to be changed is similar to that at boot-up of the electronic device 900; thus, the above description can be referred to for the details.

The controller 154 monitors signals from the optical sensors 143a to 143c, the optical sensors 144a to 144c, or the angular sensor 146, which are transmitted from the sensor controller 153. For example, the controller 154 calculates parameters for luminance and color tones, which are set by the user, and the signals from the optical sensors 143a to 143c and stores the obtained data in the scan chain register portion 231. The data is loaded from the scan chain register portion 231 to the register portion 230 when the image processing portion 160 processes image data to be shown on the first display region 905a, and controls the processing details of the image processing portion 160.

Similarly, for example, the controller 154 calculates parameters for luminance and color tones, which are set by the user, and the signals from the optical sensors 144a to 144c and stores the obtained data in the scan chain register portion 232. The data is loaded from the scan chain register portion 232 to the register portion 230 when the image processing portion 160 processes image data to be shown on the second display region 905b, and controls the processing details of the image processing portion 160.

In the foldable electronic device, the first display region 905a and the second display region 905b often face different directions, and accordingly, how the first display region 905a is exposed to the light 145 is sometimes different from how the second display region 905b is exposed to the light 145. Even in such a case, appropriate luminance and color tones can be set in the above manner in each of the first display region 905a and the second display region 905b.

States in the normal operation can be classified into, for example, a state where a moving image or the like is displayed, a state where IDS driving can be performed during still image display, and a state where no image is displayed. The description is made below on these states.

The image processing portion 160, the timing controller 173, and the like are operating in the state of displaying a moving image or the like. Change of data in the register 175 only involves the scan chain register portions 231 and 232, and thus does not affect the image processing portion 160 and the like. After data in the scan chain register portions 231 and 232 are changed, the data of the scan chain register portions 231 and 232 are collectively loaded into the register portion 230, whereby change of the data in the register 175 is completed. Moreover, the operation of the image processing portion 160 and the like is switched to the operation corresponding to the data.

In the state capable of IDS driving during still image display, the register 175 can be power-gated in a manner similar to that of the other circuits in the region 190. In that case, before the power gating is executed, data retained in the flip-flop circuits 41 and 46 are stored in the retention circuits 42 and 47 in accordance with the signals SVB1 and SVB2 in the registers 236 and 237 included in the scan chain register portions 231 and 232.

To restore the register 175 to the state before power gating, the data retained in the retention circuits 42 and 47 are loaded into the flip-flop circuits 41 and 46 in accordance with the signals LDB1 and LDB2, and the data in the flip-flop circuit 41 is loaded into the register portion 230 in accordance with the signal LDA1. Moreover, the data in the flip-flop circuit 46 is loaded into the register portion 230 in accordance with the signal LDA2.

In this manner, the data in the register 175 becomes effective in the same state as before the power gating. Note that even while the register 175 is power-gated, the parameter of the register 175 can be changed by canceling the power gating of the register 175 when change of the parameter of the register 175 is requested by the host 140.

In the state of displaying no image, the circuits in the region 190 (including the register 175), for example, can be power-gated. In that case, the operation of the host 140 may also be stopped. However, when power gating is stopped, an image (still image) before the power gating can be displayed before the host 140 is restored, because the frame memory 151 and the register 175 are nonvolatile.

For example, when the angular sensor 146 is employed in the electronic device 900 and a signal from the angular sensor 146 indicates that the electronic device 900 is folded and thus the display surface of the display device 100 is not used, the sensor controller 153, the touch sensor controller 184, and the like can be power-gated in addition to the circuits in the region 190.

When the electronic device 900 is folded, the operation of the host 140 may be stopped depending on the standard of the host 140. Even when the electronic device 900 is unfolded again while the operation of the host 140 is stopped, image data in the frame memory 151 can be shown before new image data, a variety of control signals, and the like are transmitted from the host 140, because the frame memory 151 and the register 175 are nonvolatile.

Since the register 175 includes the scan chain register portions 231 and 232 and the register portion 230 and data in the scan chain register portions 231 and 232 are changed as described above, the data can be changed smoothly without affecting the image processing portion 160, the timing controller 173, and the like. In addition, the registers 236 and 237 in the scan chain register portions 231 and 232 include the retention circuits 42 and 47, respectively, and thus can perform transfer to and restore from a power-gated state smoothly.

<Another Structure Example of Controller IC>

Another structure example of a controller IC will be described below.

Figure 12:
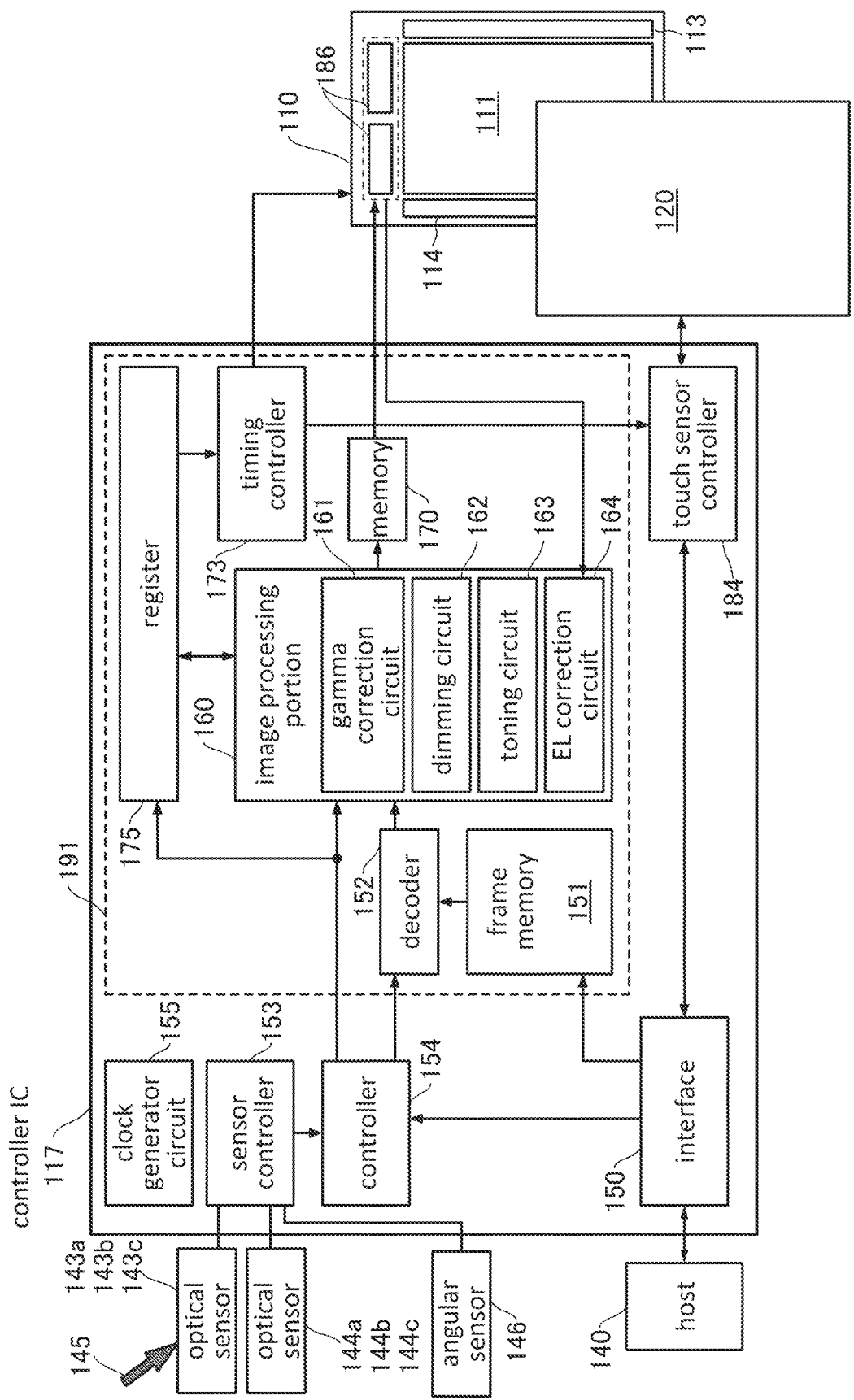
FIG. 12 is a block diagram illustrating a structure example of a controller IC.

FIG. 12 illustrates a structure example of a controller IC without a source driver. A controller IC 117 shown in FIG. 12 is a modification example of the controller IC 115 and includes a region 191. The controller 154 controls power supply to circuits in the region 191.

The controller IC 117 is not provided with a source driver 180; thus, the display unit 110 includes a source driver IC 186. The number of source driver ICs 186 is determined in accordance with the number of pixels in the pixel array 111.

The arrangement of the source driver is not limited to the above example. Like the gate drivers 113 and 114, the source driver may be formed over the substrate of the pixel array 111. In addition, the controller IC 117 may be provided with one or both of the TS driver 126 and the sensing circuit 127. The same applies to the controller IC 115.

This embodiment can be implemented in combination with any other embodiment as appropriate.

Embodiment 2

In this embodiment, structure examples of the display unit 110 will be described using cross-sectional views.

Cross-Sectional Structure Example 1

Figure 13:
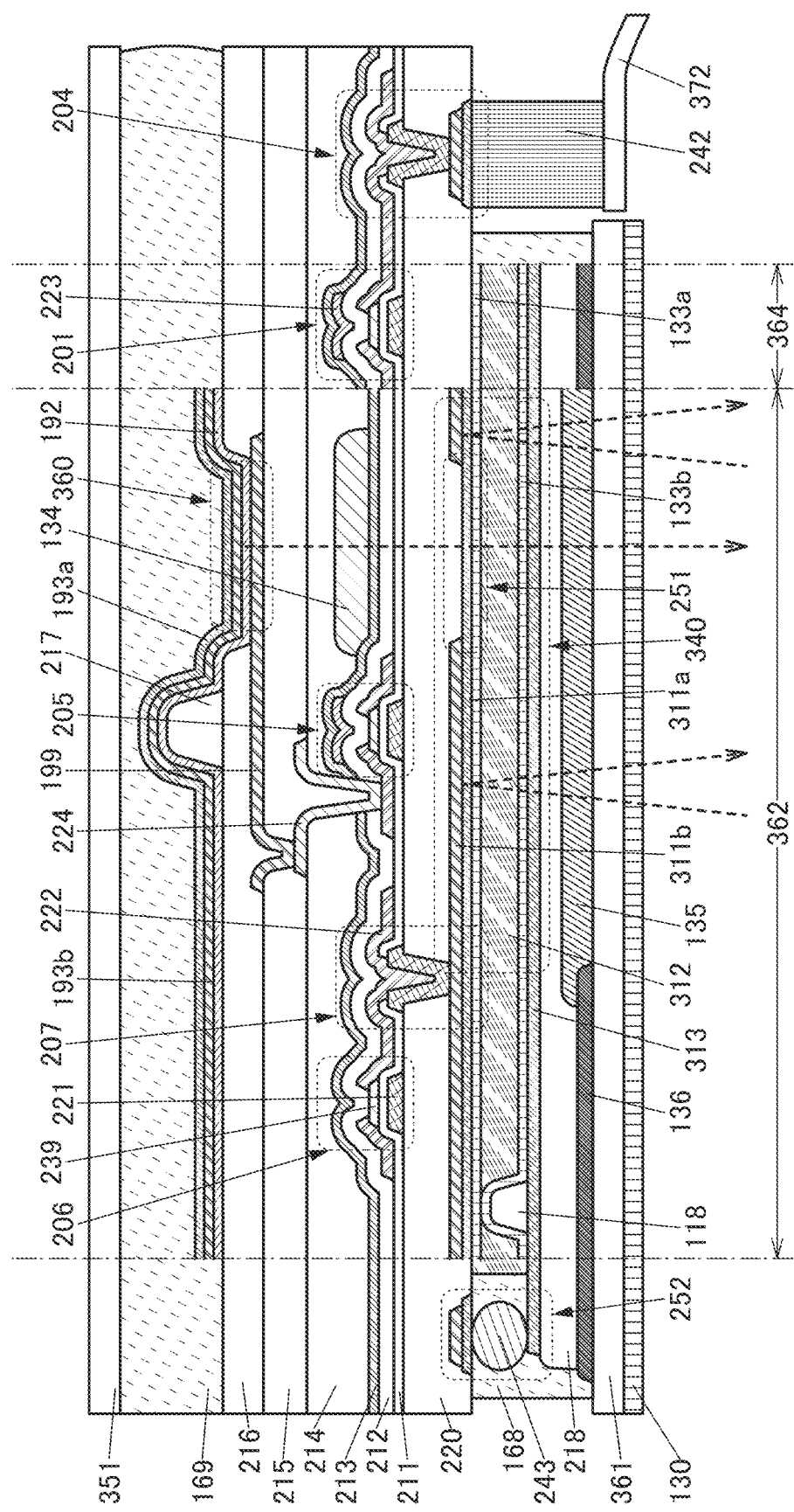
FIG. 13 is a cross-sectional view illustrating a structure example of a display device.

FIG. 13 illustrates an example of cross sections of part of a region including the gate drivers 113 and 114 and part of a region including the pixel array 111.

The display unit includes an insulating layer 220 between a substrate 351 and a substrate 361. A light-emitting element 360, a transistor 201, a transistor 205, a transistor 206, a coloring layer 134, and the like are provided between the substrate 351 and the insulating layer 220. A liquid crystal element 340, a coloring layer 135, and the like are provided between the insulating layer 220 and the substrate 361. The substrate 361 and the insulating layer 220 are attached to each other with an adhesive layer 168. The substrate 351 and the insulating layer 220 are attached to each other with an adhesive layer 169.

The coloring layer 134 can be a color filter of a primary color that transmits light of red (R), green (G), blue (B), or the like. Meanwhile, the coloring layer 135 can be a color filter of a complementary color that transmits light of cyan (C), magenta (M), yellow (Y), or the like.

The transistor 206 is electrically connected to the liquid crystal element 340. The transistor 205 is electrically connected to the light-emitting element 360. The transistors 205 and 206 are formed on a surface of the insulating layer 220 that is on the substrate 351 side, and thus can be formed through the same process.

The coloring layer 135, a light-blocking layer 136, an insulating layer 218, a conductive layer 313 serving as a common electrode of the liquid crystal element 340, an alignment film 133b, an insulating layer 118, and the like are provided over the substrate 361. The insulating layer 118 functions as a spacer for keeping the cell gap of the liquid crystal element 340.

Insulating layers such as an insulating layer 211, an insulating layer 212, an insulating layer 213, an insulating layer 214, and an insulating layer 215 are provided on the substrate 351 side of the insulating layer 220. Part of the insulating layer 211 functions as a gate insulating layer of each transistor. The insulating layers 212, 213, and 214 are provided to cover each transistor. The insulating layer 215 is provided to cover the insulating layer 214. The insulating layers 214 and 215 each function as a planarization layer. Note that an example where the three insulating layers 212, 213, and 214 are provided to cover the transistors and the like is described here; however, one embodiment of the present invention is not limited to this example, and four or more insulating layers, a single insulating layer, or two insulating layers may be provided. The insulating layer 214 serving as a planarization layer is not necessarily provided.

The transistors 201, 205, and 206 each include a conductive layer 221 part of which functions as a gate, conductive layers 222 part of which functions as a source and a drain, and a semiconductor layer 239. Here, a plurality of layers obtained by processing one conductive film are shown with the same hatching pattern.

The liquid crystal element 340 is a reflective liquid crystal element. The liquid crystal element 340 has a structure in which a conductive layer 311a, a liquid crystal 312, and the conductive layer 313 are stacked. The conductive layer 311b that reflects visible light is provided in contact with the substrate 351 side of the conductive layer 311a. The conductive layer 311b has an opening 251. The conductive layers 311a and 313 contain a material transmitting visible light. An alignment film 133a is provided between the liquid crystal 312 and the conductive layer 311a. The alignment film 133b is provided between the liquid crystal 312 and the conductive layer 313. A polarizing plate 130 is provided on an outer surface of the substrate 361.

In the liquid crystal element 340, the conductive layer 311b has a function of reflecting visible light, and the conductive layer 313 has a function of transmitting visible light. Light entering from the substrate 361 side is polarized by the polarizing plate 130, passes through the conductive layer 313 and the liquid crystal 312, and is reflected by the conductive layer 311b. Then, the light passes through the liquid crystal 312 and the conductive layer 313 again and reaches the polarizing plate 130. In this case, the alignment of the liquid crystal is controlled by a voltage applied between the conductive layer 311b and the conductive layer 313, and thus, optical modulation of light can be controlled. In other words, the intensity of light emitted through the polarizing plate 130 can be controlled. Light other than one in a particular wavelength region of the light is absorbed by the coloring layer 135, whereby emitted light is red light, for example.

The light-emitting element 360 is a bottom-emission light-emitting element. The light-emitting element 360 has a structure in which a conductive layer 199, an EL layer 192, and a conductive layer 193b are stacked in this order from the insulating layer 220 side. A conductive layer 193a is provided to cover the conductive layer 193b. The conductive layer 193b contains a material reflecting visible light, and the conductive layers 199 and 193a contain a material transmitting visible light. Light is emitted from the light-emitting element 360 to the substrate 361 side through the coloring layer 134, the insulating layer 220, the opening 251, the conductive layer 313, and the like.

Here, as illustrated in FIG. 13, the opening 251 is preferably provided with the conductive layer 311a, which transmits visible light. Accordingly, the liquid crystal 312 in a region overlapping with the opening 251 is aligned in a similar manner as in the other regions, preventing undesired light leakage caused by an alignment defect of the liquid crystal in the boundary portion of the region overlapping with the opening 251 and the other regions.

As the polarizing plate 130 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. A light diffusion plate may be provided to reduce reflection of external light. The cell gap, alignment, driving voltage, and the like of the liquid crystal element used as the liquid crystal element 340 are controlled depending on the kind of the polarizing plate so that desirable contrast is obtained.

An insulating layer 217 is provided over the insulating layer 216 that covers an end portion of the conductive layer 199. The insulating layer 217 functions as a spacer for preventing the insulating layer 220 and the substrate 351 from getting closer than necessary. When the EL layer 192 and the conductive layer 193a are formed using a shadow mask (metal mask), the insulating layer 217 may have a function of preventing the shadow mask from being in contact with a surface on which the EL layer 192 or the conductive layer 193a is formed. Note that the insulating layer 217 is not necessarily provided.

One of a source and a drain of the transistor 205 is electrically connected to the conductive layer 199 of the light-emitting element 360 through a conductive layer 224.

One of a source and a drain of the transistor 206 is electrically connected to the conductive layer 311b through a connection portion 207. The conductive layers 311a and 311b are in contact with and electrically connected to each other. Here, in the connection portion 207, the conductive layers provided on both surfaces of the insulating layer 220 are connected to each other through an opening in the insulating layer 220.

A connection portion 204 is provided in a region where the substrate 351 and the substrate 361 do not overlap with each other. The connection portion 204 is electrically connected to an FPC 372 through a connection layer 242. The connection portion 204 has a structure similar to that of the connection portion 207. On the top surface of the connection portion 204, a conductive layer obtained by processing the same conductive film as the conductive layer 311a is exposed. Thus, the connection portion 204 and the FPC 372 can be electrically connected to each other through the connection layer 242.

A connection portion 252 is provided in part of a region where the adhesive layer 168 is provided. In the connection portion 252, the conductive layer obtained by processing the same conductive film as the conductive layer 311a is electrically connected to part of the conductive layer 313 with a connector 243. Accordingly, a signal or a potential input from the FPC 372 connected to the substrate 351 side can be supplied to the conductive layer 313 formed on the substrate 361 side through the connection portion 252.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. In that case, the connector 243, which is the conductive particle, sometimes has a shape that is squeezed vertically as illustrated in FIG. 13. With the connector 243 having a squeezed shape, the contact area between the connector 243 and a conductive layer electrically connected to the connector 243 can be increased, thereby reducing contact resistance and suppressing defects such as disconnection.

The connector 243 is preferably provided to be covered with the adhesive layer 168. For example, the connector 243 is dispersed in the adhesive layer 168 before the adhesive layer 168 is cured.

FIG. 13 illustrates an example of a circuit 364 including the transistor 201.

In FIG. 13, the transistors 201 and 205 employ a structure in which the semiconductor layer 239 where a channel is formed is provided between two gates. One of the gates is formed of the conductive layer 221, and the other gate is formed of a conductive layer 223 that overlaps with the semiconductor layer 239 with the insulating layer 212 placed therebetween. Such a structure enables control of the threshold voltage of the transistor. In that case, the two gate electrodes may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display unit in which the number of wirings is increased because of increase in size or resolution.

Note that the transistor included in the circuit 364 and the transistor included in a display portion 362 may have the same structure. A plurality of transistors included in the circuit 364 may have the same structure or different structures. A plurality of transistors included in the display portion 362 may have the same structure or different structures.

A material through which impurities such as water or hydrogen do not easily diffuse is preferably used for at least one of the insulating layers 212 and 213 that cover the transistors. That is, the insulating layer 212 or the insulating layer 213 can function as a barrier film. Such a structure can effectively suppress diffusion of impurities into the transistors from the outside, and a highly reliable display unit can be provided.

The insulating layer 218 is provided on the substrate 361 side to cover the coloring layer 135 and the light-blocking layer 136. The insulating layer 218 may function as a planarization layer. The insulating layer 218 enables the conductive layer 313 to have an almost flat surface, resulting in a uniform alignment state of the liquid crystal 312.

Cross-Sectional Structure Example 2

Figure 14:
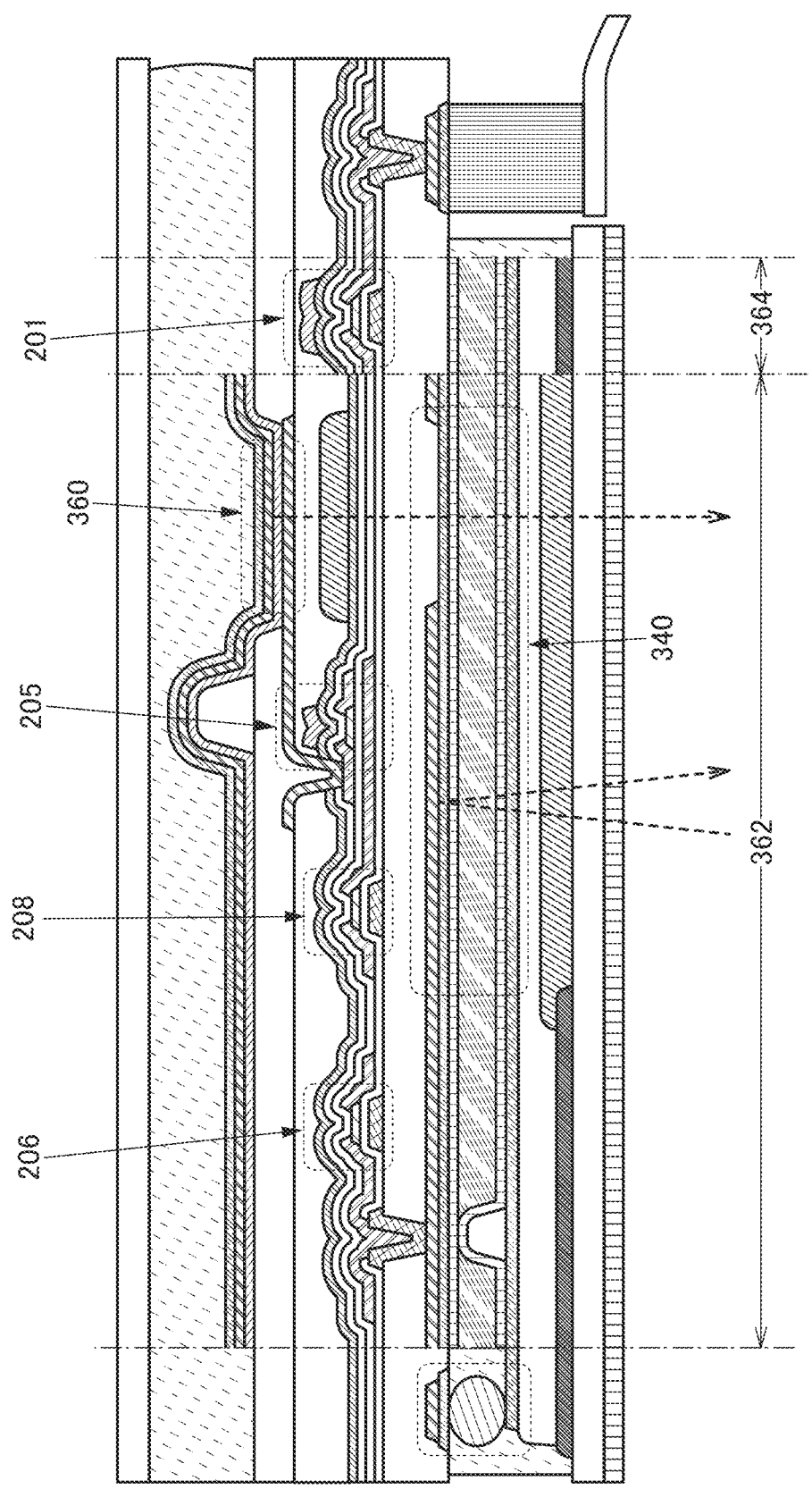
FIG. 14 is a cross-sectional view illustrating a structure example of a display device.

The display unit of one embodiment of the present invention may include a region where a first transistor and a second transistor that are provided in a pixel overlap with each other as illustrated in FIG. 14. Such a structure allows a display unit to have a smaller area per pixel and a higher pixel density enabling display of higher-resolution images.

For example, the display unit can include a region where the transistor 205 for driving the light-emitting element 360 and a transistor 208 overlap with each other. Alternatively, the display unit may include a region where the transistor 206 for driving the liquid crystal element 340 and one of the transistors 205 and 208 overlap with each other.

Cross-Sectional Structure Example 3

Figure 15:
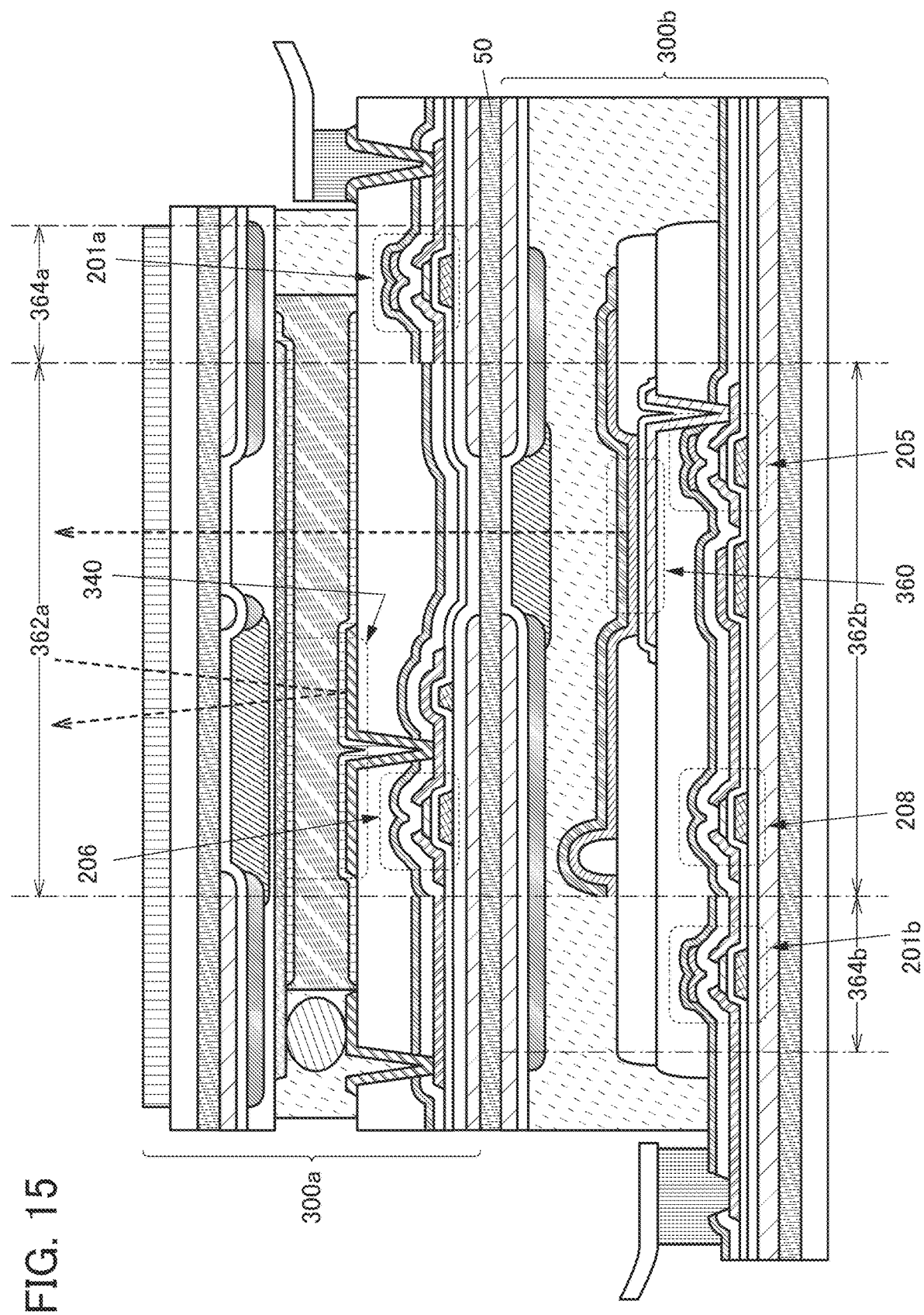
FIG. 15 is a cross-sectional view illustrating a structure example of a display device.

In the display unit of one embodiment of the present invention, a display unit 300a and a display unit 300b may be attached to each other through an adhesive layer 50 as illustrated in FIG. 15. The display unit 300a includes the liquid crystal element 340 and the transistor 206 in a display portion 362a, and a transistor 201a in a circuit 364a for driving the display portion 362a. The display unit 300b includes the light-emitting element 360 and the transistors 205 and 208 in a display portion 362b, and a transistor 201b in a circuit 364b for driving the display portion 362b.

With such a structure, it is possible to employ different manufacturing steps appropriate for each of the display units 300a and 300b, resulting in higher manufacturing yield.
[Components]
The above components will be described below.
<Substrate>
A material having a flat surface can be used for the substrate included in the display unit. The substrate through which light emitted from the display element is extracted is formed using a material that transmits the light. For example, glass, quartz, ceramic, sapphire, or an organic resin can be used.

The weight and thickness of the display unit can be decreased by using a thin substrate. A flexible display unit can be obtained by using a substrate that is thin enough to have flexibility.

Since the substrate through which emitted light is not extracted does not need to have a light-transmitting property, a metal substrate or the like can be used in addition to the above-mentioned substrates. A metal substrate, which has high thermal conductivity, is preferable because it can easily conduct heat to the whole substrate and accordingly can prevent a local temperature rise in the display unit. To obtain flexibility or bendability, the thickness of a metal substrate is preferably from 10 μm to 200 μm, further preferably from 20 μm to 50 μm.

Although there is no particular limitation on a material of a metal substrate, it is preferable to use a metal such as aluminum, copper, or nickel or an alloy such as an aluminum alloy or stainless steel, for example.

It is possible to use a substrate subjected to insulation treatment, e.g., a metal substrate whose surface is oxidized or provided with an insulating film. The insulating film may be formed, for example, by a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET with a thermal expansion coefficient of $30 \times 10^{-6}$/K or less can be suitably used. It is also possible to use a substrate in which a glass fiber is impregnated with an organic resin or a substrate whose thermal expansion coefficient is reduced by mixing an organic resin with an inorganic filler. A substrate using such a material is lightweight, and thus a display unit using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, a glass fiber using E glass, S glass, D glass, Q glass, or the like can be given. These fibers may be used in a state of a woven or nonwoven fabric, and a structure body in which this fibrous body is impregnated with a resin and the resin is cured may be used as a flexible substrate. The structure body including the fibrous body and the resin is preferably used as the flexible substrate, in which case the reliability against breaking due to bending or local pressure can be increased.

Alternatively, glass, a metal, or the like that is thin enough to have flexibility can be used as the substrate. Alternatively, a composite material where glass and a resin material are attached to each other with an adhesive layer may be used.

A hard coat layer (e.g., a silicon nitride layer or an aluminum oxide layer) by which a surface of the display unit is protected from damage, a layer of a material that can disperse pressure (e.g., an aramid resin layer), or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate can also be formed by stacking a plurality of layers. When a glass layer is used, barrier properties against water and oxygen are improved, and thus a highly reliable display unit can be provided.
<Transistor>
The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistor, a metal oxide whose energy gap is greater than or equal to 2 eV, preferably greater than or equal to 2.5 eV, further preferably greater than or equal to 3 eV can be used. A typical example is a metal oxide containing indium, and a CAC-OS described later can be used, for example.

Because of a low off-state current of a transistor that contains a metal oxide having a larger band gap and a lower carrier density than silicon, charge stored in a capacitor connected in series with the transistor can be held for a long time.

The semiconductor layer can be, for example, a film of an In-M-Zn-based oxide that contains at least indium, zinc, and M (a metal such as aluminum, titanium, gallium, germanium, yttrium, zirconium, lanthanum, cerium, tin, neodymium, or hafnium).

In the case where the metal oxide contained in the semiconductor layer is an In-M-Zn-based oxide, the atomic ratio of metal elements of a sputtering target used for forming a film of the In-M-Zn oxide preferably satisfy In M and Zn M. The atomic ratio of the metal elements (In:M:Zn) in such a sputtering target is preferably 1:1:1, 1:1:1.2, 3:1:2, 4:2:3, 4:2:4.1, 5:1:6, 5:1:7, or 5:1:8, for example. Note that the atomic ratio of the metal elements in the formed oxide semiconductor layer varies from the above atomic ratios of the metal elements of the sputtering targets in a range of ±40%.

The bottom-gate transistor described in this embodiment is preferable because the number of manufacturing steps can be reduced. When a metal oxide, which can be formed at a lower temperature than polycrystalline silicon, is used for the bottom-gate transistor, materials with low heat resistance can be used for a wiring, an electrode, or a substrate below the semiconductor layer; thus, the range of choices of materials can be widened. For example, an extremely large glass substrate can be favorably used.

A metal oxide film with a low carrier density is used as the semiconductor layer. For example, the semiconductor layer can be formed using a metal oxide whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$ and is higher than or equal to $1\times10^{-9}/cm^3$. Such a metal oxide is referred to as a highly purified intrinsic or substantially highly purified intrinsic metal oxide. Such a metal oxide has a low impurity concentration and a low density of defect states and can thus be regarded as having stable characteristics.

Note that without limitation to the above examples, a material with an appropriate composition can be used depending on required semiconductor characteristics and electrical characteristics (e.g., field-effect mobility and threshold voltage) of the transistor. To obtain required semiconductor characteristics of the transistor, the carrier density, impurity concentration, defect density, atomic ratio between a metal element and oxygen, interatomic distance, density, and the like of the semiconductor layer are preferably set to appropriate values.

When silicon or carbon, which are elements belonging to Group 14, is contained in the metal oxide included in the semiconductor layer, oxygen vacancies are increased in the semiconductor layer and the semiconductor layer becomes n-type. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal may generate carriers when bonded to a metal oxide, in which case the off-state current of the transistor may be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

When nitrogen is contained in the metal oxide included in the semiconductor layer, electrons serving as carriers are generated and the carrier density increases, so that the semiconductor layer easily becomes n-type. Thus, a transistor including a metal oxide that contains nitrogen is likely to be normally-on. Hence, the concentration of nitrogen of the semiconductor layer measured by secondary ion mass spectrometry is preferably lower than or equal to $5\times10^{18}$ atoms/cm$^3$.

The semiconductor layer may have a non-single-crystal structure, for instance. Examples of the non-single-crystal structure include a CAAC-OS (c-axis-aligned crystalline oxide semiconductor, or c-axis-aligned a-b-plane-anchored crystalline oxide semiconductor) including a c-axis-aligned crystal, a polycrystalline structure, a microcrystalline structure, and an amorphous structure. Among the non-single-crystal structures, the amorphous structure has the highest density of defect states, whereas the CAAC-OS has the lowest density of defect states.

A metal oxide film with the amorphous structure has, for example, disordered atomic arrangement and no crystalline component. Alternatively, an oxide film with the amorphous structure has, for example, an absolutely amorphous structure and no crystal part.

Note that the semiconductor layer may be a mixed film including two or more of the following: a region with an amorphous structure, a region with a microcrystalline structure, a region with a polycrystalline structure, a CAAC-OS region, and a region with a single crystal structure. The mixed film has, for example, a single-layer structure or a stacked-layer structure including two or more of the above regions in some cases.

<Composition of CAC-OS>

Described below is the composition of a cloud-aligned composite oxide semiconductor (CAC-OS) applicable to a transistor disclosed in one embodiment of the present invention.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide used in an active layer of a transistor is sometimes called an oxide semiconductor. That is, an OS FET is a transistor containing a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element that relatively tends to serve as an insulator among elements included in a metal oxide serves as a dielectric region. In contrast, a region including an unevenly distributed element that relatively tends to serve as a conductor among the elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, an oxide semiconductor preferably contains indium and zinc. In addition, an oxide semiconductor may contain an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like).

For example, of the CAC-OS, an In—Ga—Zn oxide with the CAC composition (such an In—Ga—Zn oxide can be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has a higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS containing In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

When one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<Structure of Samples and Formation Method Thereof>

Nine samples of one embodiment of the present invention are described below. The samples are formed at different substrate temperatures and with different oxygen gas flow rate ratios in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as the oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide for the nine samples, the substrate temperature is set to a temperature that is not increased by intentional heating (hereinafter such a temperature is also referred to as a room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<Analysis by X-Ray Diffraction>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 16:
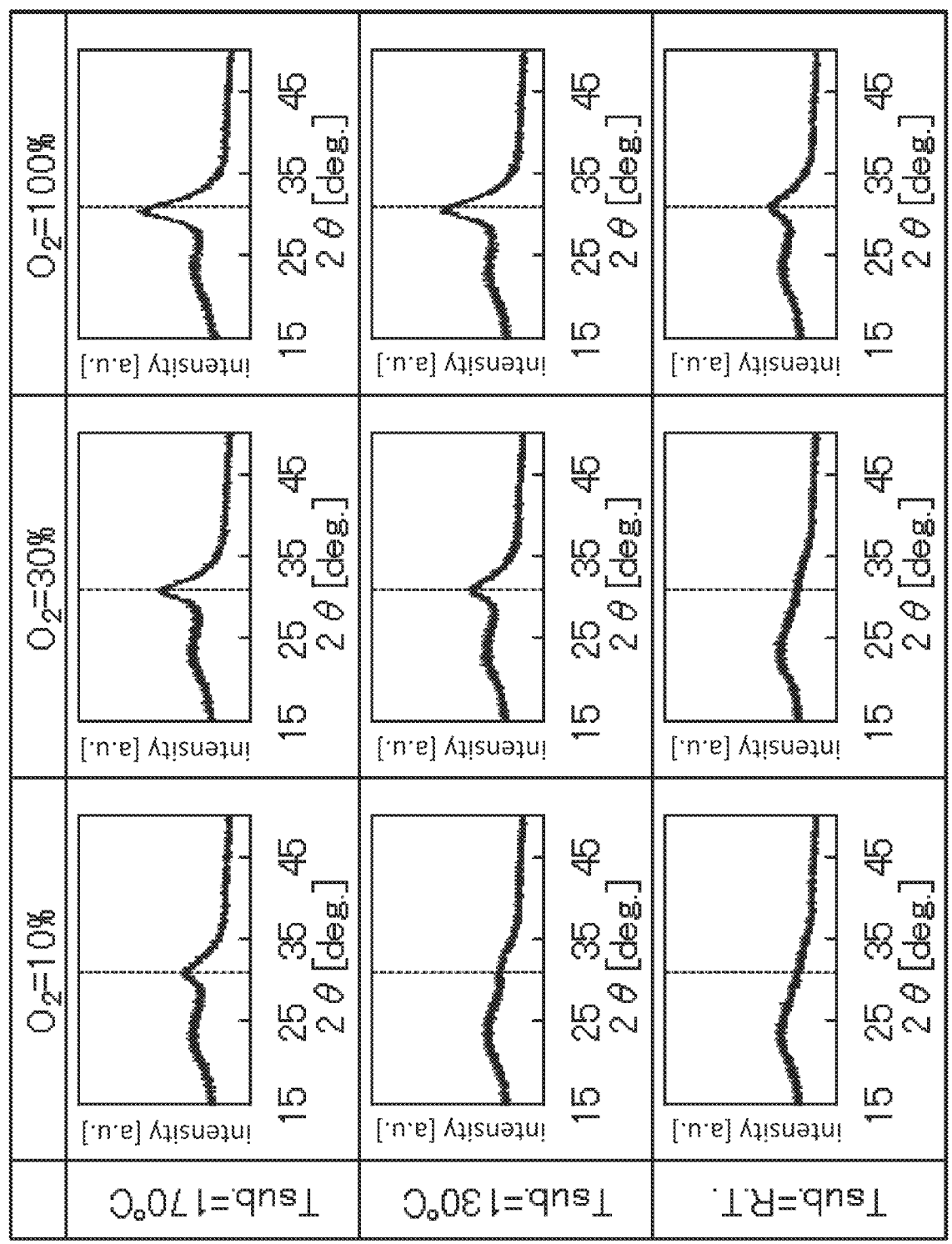
FIG. 16 shows measured XRD spectra of samples.

FIG. 16 shows XRD spectra of the samples measured by an out-of-plane method. In FIG. 16, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 16, the higher the substrate temperature at the time of formation is or the higher the oxygen gas flow rate ratio at the time of formation is, the higher the intensity of the peak at around $2\theta=31°$ is. Note that it is found that the peak at around $2\theta=31°$ is derived from a crystalline IGZO compound with c-axes aligned in a direction substantially perpendicular to its formation surface or top surface (such a compound can be referred to as c-axis-aligned crystalline (CAAC) IGZO).

As shown in the XRD spectra in FIG. 16, as the substrate temperature at the time of formation is lower or the oxygen gas flow rate ratio at the time of formation is lower, a peak becomes less clear. Accordingly, it is clear that there is no alignment in the a-b plane direction or c-axis alignment in the measured areas of the samples that are formed at a lower substrate temperature or with a lower oxygen gas flow rate ratio.

<Analysis with Electron Microscope>

This section shows the observation and analysis results of the samples formed at a substrate temperature of R.T. and an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of a plan-view image and a cross-sectional image obtained with an HAADF-STEM (also referred to as a plan-view TEM image and a cross-sectional TEM image, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 17A is a plan-view TEM image of the sample formed at a substrate temperature of R.T. and an oxygen gas flow rate ratio of 10%. FIG. 17B is a cross-sectional TEM image of the sample formed at a substrate temperature of R.T. and an oxygen gas flow rate ratio of 10%.

<Analysis of Electron Diffraction Patterns>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 17A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 17C, 17D, 17E, 17F, and 17G show the results of the points indicated by the black dots a1, a2, a3, a4, and a5, respectively.

In FIGS. 17C, 17D, 17E, 17F, and 17G, regions with high luminance in a circular (ring) pattern can be shown. Furthermore, a plurality of spots can be shown in the ring-shaped region.

Electron diffraction patterns of points indicated by black dots b1, b2, b3, b4, and b5 in the cross-sectional TEM image in FIG. 17B of the sample formed at a substrate temperature of R.T. and an oxygen gas flow rate ratio of 10% are observed. FIGS. 17H, 17I, 17J, 17K, and 17L show the results of the points indicated by the black dots b1, b2, b3, b4, and b5, respectively.

In FIGS. 17H, 17I, 17J, 17K, and 17L, regions with high luminance in a ring pattern can be shown. Furthermore, a plurality of spots can be shown in the ring-shaped region.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Moreover, in a nanobeam electron diffraction pattern of the nc-OS, regions with high luminance in a circular (ring) pattern are sometimes shown, and in addition, a plurality of bright spots are shown in a ring-like shape in some cases.

The electron diffraction pattern of the sample formed at a substrate temperature of R.T. and an oxygen gas flow rate ratio of 10% has regions with high luminance in a ring pattern and a plurality of bright spots appear in the ring-like pattern. Accordingly, the sample formed at a substrate temperature of R.T. and an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<Elementary Analysis>

This section describes the analysis results of elements included in the sample formed at a substrate temperature of R.T. and an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-rays of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms at the point are calculated. An EDX mapping image indicating distributions of proportions of atoms can be obtained through the process in an analysis target region of a sample.

Figure 18A:
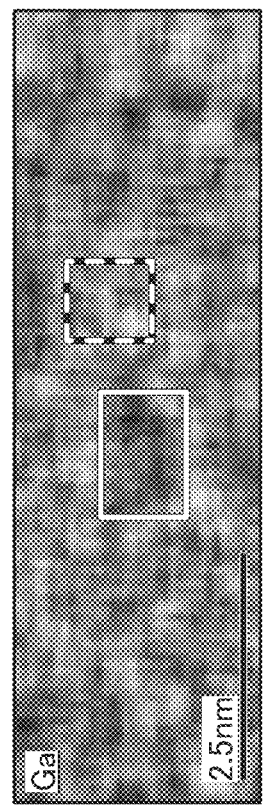
FIGS. 18A to 18C show EDX mapping images of a sample.
Figure 18B:
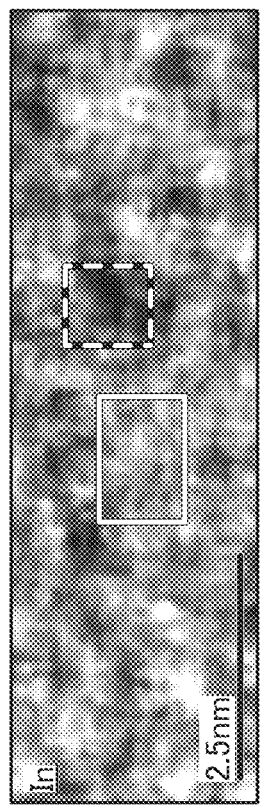
Figure 18C:
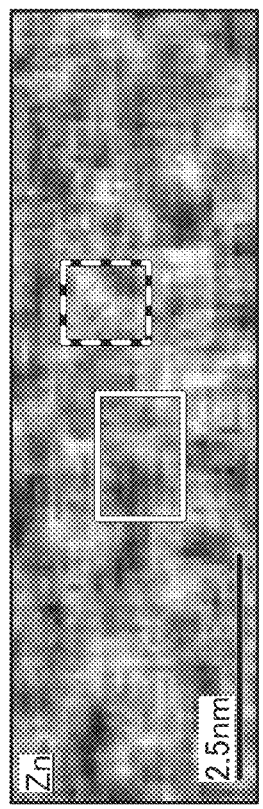

FIGS. 18A to 18C show EDX mapping images in a cross section of the sample formed at a substrate temperature of R.T. and an oxygen gas flow rate ratio of 10%. FIG. 18A shows an EDX mapping image of Ga atoms; the proportion of the Ga atoms in all the atoms is 1.18 atomic % to 18.64 atomic %. FIG. 18B shows an EDX mapping image of In atoms; the proportion of the In atoms in all the atoms is 9.28 atomic % to 33.74 atomic %. FIG. 18C shows an EDX mapping image of Zn atoms; the proportion of the Zn atoms in all the atoms is 6.69 atomic % to 24.99 atomic %. FIGS. 18A to 18C show the same region in the cross section of the sample formed at a substrate temperature of R.T. and an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 18A to 18C is 7200000 times.

The EDX mapping images in FIGS. 18A to 18C show relative distribution of brightness indicating that each element has a distribution in the sample formed at a substrate temperature of R.T. and an oxygen gas flow rate ratio of 10%. Areas surrounded by solid lines and areas surrounded by dashed lines in FIGS. 18A to 18C are examined.

In FIG. 18A, a relatively dark region occupies a large area in the area surrounded by the solid line, whereas a relatively bright region occupies a large area in the area surrounded by the dashed line. In FIG. 18B, a relatively bright region occupies a large area in the area surrounded by the solid line, whereas a relatively dark region occupies a large area in the area surrounded by the dashed line.

That is, the areas surrounded by the solid lines are regions including a relatively large number of In atoms, and the areas surrounded by the dashed lines are regions including a relatively small number of In atoms. In FIG. 18C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms, and the area surrounded by the dashed line is a region including a relatively large number of Ga atoms. In FIG. 18C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 18A to 18C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ or $InO_{X1}$ as a main component extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO with a single crystal, polycrystalline, or CAAC structure. Alternatively, the crystal structure is defined as having high luminance regions appearing in a ring pattern in addition to the several or more bright spots.

As shown in FIGS. 18A to 18C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Preferably, the diameter of a region including each metal element as a main component is greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element including a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit (typically, a gate driver that generates a gate signal) allows a display device to have a narrow bezel. Moreover, the use of the transistor in a source driver that is included in a display device and supplies a signal from a signal line (particularly in a demultiplexer connected to an output terminal of a shift register included in the source driver) can reduce the number of wirings connected to the display device.

The transistor including a CAC-OS in the semiconductor layer does not need a laser crystallization step necessary for a transistor including low-temperature polysilicon. Thus, the manufacturing cost of a display device can be reduced even when the display device is formed using a large substrate. In addition, it is preferable to use the transistor including a CAC-OS in the semiconductor layer for a driver circuit and a display portion in a large display device having high resolution such as ultra-high definition ("4K resolution," "4K2K," and "4K") or super high definition ("8K resolution," "8K4K," and "8K"), in which case writing can be performed in a short time and display defects can be reduced.

Alternatively, silicon may be used as a semiconductor in which a channel of a transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer in the bottom-gate transistor, materials with low heat resistance can be used for a wiring, an electrode, and a substrate below the semiconductor layer, resulting in wider choice of materials. For example, an extremely large glass substrate can be favorably used. Meanwhile, a top-gate transistor is preferable because an impurity region is easily formed in a self-aligned manner and variations in characteristics can be reduced. A top-gate transistor is suitable particularly when polycrystalline silicon, single crystal silicon, or the like is used.

<Conductive Layer>

As materials for a gate, a source, and a drain of a transistor and conductive layers such as a wiring and an electrode included in a display device, a metal such as aluminum, titanium, chromium, nickel, copper, yttrium, zirconium, molybdenum, silver, tantalum, and tungsten, or an alloy containing any of these metals as its main component can be used. A single-layer structure or stacked-layer structure including a film containing any of these materials can be employed. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of shape processing by etching is increased.

As a light-transmitting conductive material, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of any of these metal materials (e.g., titanium nitride). In the case of using the metal material or the alloy material (or the nitride thereof), the film thickness is set small enough to transmit light. Alternatively, a stacked film of any of the above materials can be used as the conductive layer. For example, a stacked film of indium tin oxide and an alloy of silver and magnesium is preferably used because the conductivity can be increased. The above materials can also be used for conductive layers such as a variety of wirings and electrodes included in a display device, and conductive layers included in a display element (e.g., conductive layers serving as a pixel electrode or a common electrode).

<Insulating Layer>

Examples of an insulating material that can be used for the insulating layers include resins such as an acrylic resin and an epoxy resin; a resin having a siloxane bond; and inorganic insulating materials such as silicon oxide, silicon oxynitride, silicon nitride oxide, silicon nitride, and aluminum oxide.

The light-emitting element is preferably provided between a pair of insulating films with low water permeability, in which case impurities such as water can be prevented from entering the light-emitting element. Thus, a decrease in device reliability can be prevented.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

<Liquid Crystal Element>

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. Other than the VA mode, the liquid crystal element can employ, for example, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode.

The liquid crystal element controls transmission or non-transmission of light utilizing an optical modulation action of liquid crystal. Note that optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either positive liquid crystal or negative liquid crystal can be used; an appropriate liquid crystal material needs to be selected depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which a chiral material is mixed to account for several weight percent or more is used for the liquid crystal layer in order to widen the temperature range. A liquid crystal composition that includes liquid crystal exhibiting a blue phase and a chiral material has a short response time and optical isotropy, which makes the alignment process unneeded. Moreover, such a liquid crystal composition has a small viewing angle dependence. An alignment film does not need to be provided and rubbing treatment is thus not necessary; accordingly, electrostatic discharge damage caused by the rubbing treatment can be prevented, and defects and damage of a display device in the manufacturing process can be reduced.

The liquid crystal element can be a transmissive liquid crystal element, a reflective liquid crystal element, a transflective liquid crystal element, or the like.

More specifically, a reflective liquid crystal element can be used in one embodiment of the present invention.

In the case of using a transmissive or transflective liquid crystal element, two polarizing plates are provided such that a pair of substrates is sandwiched therebetween. Furthermore, a backlight is provided on the outer side of the polarizing plate. The backlight can be a direct-type backlight or an edge-lit backlight. A direct-type backlight including a light-emitting diode (LED) is preferable because local dimming is easily performed and thus the contrast can be increased. Meanwhile, an edge-lit backlight is preferable because the thickness of a module including the backlight can be reduced.

In the case of using a reflective liquid crystal element, a polarizing plate is provided on a display surface. In addition, a light diffusion plate is preferably provided on the display surface to improve visibility.

In the case of using a reflective or transflective liquid crystal element, a front light may be provided outside the polarizing plate. As the front light, an edge-lit front light is preferably used. A front light including an LED is preferably used to reduce power consumption.

<Light-Emitting Element>

As the light-emitting element, a self-luminous element can be used, and an element whose luminance is controlled by current or voltage is included in the category of the light-emitting element. For example, an LED, an organic EL element, or an inorganic EL element can be used.

The light-emitting element has a top-emission structure, a bottom-emission structure, a dual-emission structure, or the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed using a low-molecular compound or a high-molecular compound and may also contain an inorganic compound. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer, and a light-emitting substance contained in the EL layer emits light.

When a light-emitting element that emits white light is used as the light-emitting element, the EL layer preferably contains two or more kinds of light-emitting substances. For example, two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

Preferably, a light-emitting layer containing a light-emitting material emitting light of one color and a light-emitting layer containing a light-emitting material emitting light of another color are stacked in the EL layer. For example, a plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (e.g., a host material or an assist material) and no light-emitting material may be provided. This facilitates the manufacture of the light-emitting element and decreases the driving voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layer. For example, a stacked film of indium tin oxide and an alloy of silver and magnesium is preferably used, in which case the conductivity can be increased. Further alternatively, graphene or the like may be used.

For the conductive film that reflects visible light, a metal material such as aluminum, gold, platinum, silver, nickel, tungsten, chromium, molybdenum, iron, cobalt, copper, or palladium or an alloy containing any of these metal materials can be used, for example. Lanthanum, neodymium, germanium, or the like may be added to the metal material or the alloy. Alternatively, an alloy containing aluminum (an aluminum alloy), such as an alloy of aluminum and titanium, an alloy of aluminum and nickel, or an alloy of aluminum and neodymium may be used. Alternatively, an alloy containing silver, such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide or a stack of an alloy of silver and magnesium and indium tin oxide can be used.

Each of the electrodes can be formed by an evaporation method or a sputtering method. Alternatively, a discharging method such as an inkjet method, a printing method such as a screen printing method, or a plating method can be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, or a polymer). For example, a quantum dot used for the light-emitting layer can serve as a light-emitting material.

The quantum dot can be a colloidal quantum dot, an alloyed quantum dot, a core-shell quantum dot, a core quantum dot, or the like. A material containing elements belonging to Groups 12 and 16, elements belonging to Groups 13 and 15, or elements belonging to Groups 14 and 16 may be used. Alternatively, a quantum dot containing an element such as cadmium, selenium, zinc, sulfur, phosphorus, indium, tellurium, lead, gallium, arsenic, or aluminum may be used.

<Adhesive Layer>

As the adhesive layer, any of a variety of curable adhesives such as a photo-curable adhesive (e.g., an ultraviolet curable adhesive), a reactive curable adhesive, a thermosetting curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display unit.

In addition, it is preferable to mix a filler with a high refractive index or a light-scattering member into the resin, in which case light extraction efficiency can be enhanced. For example, titanium oxide, barium oxide, zeolite, or zirconium can be used.

<Connection Layer>

As the connection layer, an anisotropic conductive film (ACF), an anisotropic conductive paste (ACP), or the like can be used.

<Coloring Layer>

Examples of a material that can be used for the coloring layer include a metal material, a resin material, and a resin material containing a pigment or dye.

<Light-Blocking Layer>

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stack of films containing materials of the coloring layer can also be used for the light-blocking layer. For example, it is possible to employ a stacked-layer structure of a film containing a material of a coloring layer that transmits light of a certain color and a film containing a material of a coloring layer that transmits light of another color. The coloring layer and the light-blocking layer are preferably formed using the same material because the same manufacturing apparatus can be used and the process can be simplified.

At least part of this embodiment can be implemented in combination with any other embodiment described in this specification as appropriate.

This application is based on Japanese Patent Application Serial No. 2016-196153 filed with Japan Patent Office on Oct. 4, 2016, the entire contents of which are hereby incorporated by reference.

What is claimed is:

1. A semiconductor device comprising:
   a first display region;
   a second display region;
   a first controller;
   a register comprising a first register, a first scan chain register and a second scan chain register;
   a frame memory; and
   an image processing portion,
   wherein:
   the first scan chain register comprising a second register,
   the second scan chain register comprising a third register,
   the frame memory is configured to store image data,
   the image processing portion is configured to process the image data,
   the register is configured to store a parameter for converting the image data into correction data in the image processing portion,
   the frame memory is configured to retain the image data while power supply to the frame memory is stopped,
   the register is configured to retain the parameter while power supply to the register is stopped, the first controller is configured to control power supply to the register, power supply to the frame memory, and power supply to the image processing portion, first data is data used to generate display data output to the first display region, second data is data used to generate display data output to the second display region, the first data is output to the first register from the second register, and the second data is output to the first register from the third register, the first register is configured to select one of the first data and the second data and store the selected data, the first register is configured to output the stored data to the image processing portion as the parameter, the second register and the third register each comprise a retention circuit, the retention circuit in the second register is configured to store the first data, the retention circuit in the third register is configured to store the second data, and each of the retention circuits is configured to retain the stored data while power supply to the register is stopped.

2. The semiconductor device according to claim 1, wherein:

each of the retention circuits comprises a first transistor and a first capacitor, the first transistor is configured to control charging and discharging of the first capacitor, and a channel formation region of the first transistor comprises a metal oxide.

3. The semiconductor device according to claim 1, wherein:

the frame memory comprises a plurality of memory cells, each of the memory cells comprises a second transistor and a second capacitor, the second transistor is configured to control charging and discharging of the second capacitor, and a channel formation region of the second transistor comprises a metal oxide.

4. The semiconductor device according to claim 1, further comprising a second controller, wherein the second controller is configured to generate a timing signal, and wherein the register is configured to store a parameter for generating the timing signal in the second controller.

5. The semiconductor device according to claim 4, wherein the first controller is configured to control power supply to the second controller.

6. The semiconductor device according to claim 1, further comprising a third controller, wherein the third controller is configured to receive a first signal from an optical sensor, and to generate, on the basis of the first signal, a second signal for performing processing in the image processing portion.

7. The semiconductor device according to claim 1, configured to, when image data and a parameter are not input from an external device, generate a third signal for displaying a still image, on the basis of the image data stored in the frame memory and the parameter stored in the register.

8. The semiconductor device according to claim 1, further comprising a source driver, wherein the source driver is configured to generate a data signal on the basis of the image data processed in the image processing portion.

9. The semiconductor device according to claim 1, further comprising a source driver, wherein:

the source driver is configured to generate a first data signal or a second data signal on the basis of the image data processed in the image processing portion, the first data signal is configured to drive a reflective element, and the second data signal is configured to drive a light-emitting element.

10. The semiconductor device according to claim 8, wherein the first controller is configured to control power supply to the source driver.

* * * * *